(12) United States Patent
Ishida

(10) Patent No.: US 7,797,121 B2
(45) Date of Patent: Sep. 14, 2010

(54) TEST APPARATUS, AND DEVICE FOR CALIBRATION

(75) Inventor: Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/759,235

(22) Filed: Jun. 7, 2007

(65) Prior Publication Data

US 2008/0304608 A1 Dec. 11, 2008

(51) Int. Cl.
*G01D 3/00* (2006.01)
*G06K 5/04* (2006.01)
*H04L 7/00* (2006.01)

(52) U.S. Cl. .................. 702/108; 714/700; 375/371

(58) Field of Classification Search ......... 702/107–108, 702/117–118, 125, 69–72, 79, 81, 84–85, 702/89, 182–183, 57–59, 110–112, 120–121; 714/700, 735, 738, 715, 724; 324/537, 755, 324/763, 76.52, 76.77; 375/224, 226, 371
See application file for complete search history.

(56) References Cited

U.S. PATENT DOCUMENTS 6,324,485 B1 * 11/2001 Ellis ........................... 702/117

(Continued)

OTHER PUBLICATIONS

Yamaguchi et al., A Method for Measuring the Cycle-toCycle Period Jitter of High-Frequency Clock Signals, 2001 IEEE, pp. 102-110.*

(Continued)

*Primary Examiner*—Michael P Nghiem
*Assistant Examiner*—Toan M Le
(74) *Attorney, Agent, or Firm*—Sterne, Kessler, Goldstein & Fox P.L.L.C.

(57) ABSTRACT

The test apparatus includes a first comparator and a second comparator that measure a measured signal output from the device under test at a given sampling clock timing, a deciding section that decides a quality of the device under test on the basis of a measurement result in the first comparator and the second comparator, a control section that causes the first comparator and the second comparator to input an adjustment signal having a previously injected jitter and respectively sample the input signal, a skew computing section that computes a skew between the first comparator and the second comparator on the basis of sampling results, and a phase adjusting section that adjusts a phase of at least any one of the measured signal and the sampling clock in at least any one of the first comparator and the second comparator on the basis of the skew.

17 Claims, 16 Drawing Sheets

U.S. PATENT DOCUMENTS

| | | | |
|---|---|---|---|
| 6,460,001 B1* | 10/2002 | Yamaguchi et al. | 702/69 |
| 6,604,203 B1* | 8/2003 | Mu et al. | 713/400 |
| 6,820,234 B2* | 11/2004 | Deas et al. | 714/814 |
| 6,956,395 B2* | 10/2005 | Oshima et al. | 324/765 |
| 7,127,018 B2 | 10/2006 | Yamaguchi et al. | |
| 7,260,493 B2* | 8/2007 | Laquai et al. | 702/117 |
| 7,313,496 B2* | 12/2007 | Ishida et al. | 702/111 |
| 7,317,309 B2* | 1/2008 | Yamaguchi et al. | 324/76.19 |
| 7,356,109 B2* | 4/2008 | Yamaguchi et al. | 375/371 |
| 7,394,238 B2* | 7/2008 | Ochiai et al. | 324/76.35 |
| 7,421,355 B2* | 9/2008 | Hou et al. | 702/69 |
| 7,434,118 B2* | 10/2008 | Moessinger et al. | 714/715 |
| 2006/0087346 A1* | 4/2006 | Ishida et al. | 327/3 |
| 2007/0247181 A1* | 10/2007 | Ishida et al. | 324/765 |
| 2007/0260947 A1* | 11/2007 | Hou | 714/718 |
| 2008/0040060 A1* | 2/2008 | Hou et al. | 702/82 |
| 2008/0192814 A1* | 8/2008 | Hafed et al. | 375/224 |

OTHER PUBLICATIONS

Shimanouchi, M., Timing Accuracy Enhancement by a New Calibration Scheme for Multi-Gbps ATE, 2004 IEEE, pp. 567-576.*

Article Titled "Jitter Analysis Clock Solutions", in Wavecrest Corporation, 1998 U.S.A.

* cited by examiner

TEST APPARATUS, AND DEVICE FOR CALIBRATION

BACKGROUND

1. Technical Field

The present invention relates to a test apparatus and a device for calibration. More particularly, the present invention relates to a test apparatus that can adjust skews between drivers or between comparators.

2. Related Art

As a test apparatus for testing a device under test such as a semiconductor circuit, an apparatus including a plurality of drivers and a plurality of comparators is known. The plurality of drivers are circuits that input test signals into a plurality of input terminals of the device under test, and the plurality of comparators are circuits that measure measured signals from a plurality of output terminals of the device under test.

When providing the test signals to the plurality of input pins of the device under test to test the device, it is preferable that the test signals are input into the plurality of input pins at the same time or with a predetermined timing difference. Moreover, when measuring the measured signals from the plurality of output pins of the device under test, it is preferable that the measured signals are input into the plurality of comparators at the same time or with a predetermined timing difference.

However, the plurality of test signals or the plurality of measured signals has an indeterminate skew due to fluctuation of output timings of test signals in the plurality of drivers, delay amounts of transmission routes, sampling timings in the plurality of comparators, and so on. For this reason, it is preferable to measure this skew before testing the device under test and previously perform calibration compensating for the skew.

As a technique for measuring skews between plural signals, there is considered a technique for statistically measuring skews by means of a time interval analyzer, a frequency counter, or the like. For example, there is known a technique for measuring timing differences at a zero crossing point of measured signals by means of a time interval analyzer and measuring skews on the basis of a distribution of the timing differences (for example, see "Jitter Analysis Clock Solutions", Wavecrest Corp., 1998).

Moreover, a technique for computing an instantaneous phase from an analytic signal of a measured signal and computing a skew from an initial phase difference of the instantaneous phase is proposed as disclosed, for example, in U.S. Pat. No. 7,127,018.

However, a technique using a time interval analyzer or the like has a dead time for which measurement cannot be performed from measuring a timing at one zero crossing point to measuring a timing at the next zero crossing point. For this reason, measuring data necessary for acquiring sufficient measurement accuracy extremely requires time.

Moreover, in a technique using an analytic signal, the analytic signal is computed from a result obtained by sampling a measured signal. At this time, it is preferable to use an A/D converter having about eight-bit resolution in an amplitude direction in order to compute the analytic signal with high precision. However, in the case of a measurement pin of a semiconductor testing apparatus or the like, it is difficult to measure a skew with high accuracy because a one-bit comparator samples a measured signal in order to detect a logical value of the measured signal.

SUMMARY

Therefore, it is an object of some aspects of the present invention to provide a test apparatus and a device for calibration that can solve the foregoing problems. The above and other objects can be achieved by combinations described in the independent claims. The dependent claims define further advantageous and exemplary combinations of the present invention.

To solve the problem, according to the first aspect of the present invention, there is provided a test apparatus that tests a device under test. The test apparatus includes: a first comparator and a second comparator that measure a measured signal output from the device under test at a given sampling clock timing; a deciding section that decides a quality of the device under test on the basis of a measurement result in the first comparator and the second comparator; a control section that causes the first comparator and the second comparator to input an adjustment signal having a previously injected jitter and respectively sample the input signal; a skew computing section that computes a skew between the first comparator and the second comparator on the basis of a sampling result in the first comparator and a sampling result in the second comparator; and a phase adjusting section that adjusts a phase of at least any one of the measured signal and the sampling clock in at least any one of the first comparator and the second comparator on the basis of the skew computed from the skew computing section.

According to the second aspect of the present invention, there is provided a test apparatus that tests a device under test. The test apparatus includes: a first driver and a second driver that measure a test signal to be input into the device under test at a given output timing; a deciding section that decides a quality of the device under test on the basis of a measured signal output from the device under test in accordance with the test signal; a control section that causes the first driver and the second driver to output a first adjustment signal and a second adjustment signal having an injected jitter; a first sampling section and a second sampling section that sample the first adjustment signal and the second adjustment signal output from the first driver and the second driver at a given sampling clock timing; a skew computing section that computes a skew between the first driver and the second driver on the basis of sampling results in the first sampling section and the second sampling section; and a phase adjusting section that adjusts the output timing of at least one of the first driver and the second driver on the basis of the skew computed from the skew computing section.

According to the third aspect of the present invention, there is provided a device for calibration that is used for measuring a skew between drivers in a test apparatus having a plurality of drivers for outputting test signals to a device under test and a plurality of comparators for measuring measured signals from the device under test. The device for calibration includes: a plurality of input pins that are provided one-to-one corresponding to the plurality of drivers and receive the test signal from the corresponding driver; a jitter injecting section that respectively injects a jitter into the test signals received by the input pins; and a plurality of output pins that are provided one-to-one corresponding to the plurality of comparators and input each of the test signals having the jitter injected by the jitter injecting section into the corresponding comparator.

According to the fourth aspect of the present invention, there is provided a device for calibration that is used for measuring a skew between comparators in a test apparatus having a driver for supplying a signal and a plurality of comparators for measuring measured signals from a device under test. The device for calibration includes: an input pin that receives the signal from the driver; a jitter injecting section that injects a jitter into the signal received by the input pin; and a plurality of output pins that are provided one-to-one corresponding to the plurality of comparators, and split and receive the signal having the jitter injected by the jitter injecting section and respectively input the received signal into the corresponding comparator.

According to the fifth aspect of the present invention, there is provided a device for calibration that is used for measuring a skew between drivers and a skew between comparators in a test apparatus having a plurality of drivers for outputting test signals to a device under test and a plurality of comparators for measuring measured signals from the device under test. The device for calibration includes: a plurality of input pins that are provided one-to-one corresponding to the plurality of drivers and receive a signal having a previously injected jitter from the corresponding driver; a plurality of output pins that are provided one-to-one corresponding to the plurality of comparators and input the received signal into the corresponding comparator; and a connection switching section that inputs the signal received by the corresponding input pin into each output pin when measuring the skew between the plurality of drivers and mutually inputs the signal received by any one of the input pins into the plurality of output pins when measuring the skew between the plurality of comparators.

According to the sixth aspect of the present invention, there is provided a device for calibration that is used for measuring a skew between comparators in a test apparatus having a plurality of comparators for measuring measured signals from a device under test. The device for calibration includes: a signal generating section that generates a signal having an injected jitter; and a plurality of output pins that are provided one-to-one corresponding to the plurality of comparators, and respectively split and receive the signal from the signal generating section and respectively input the received signal into the corresponding comparator.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
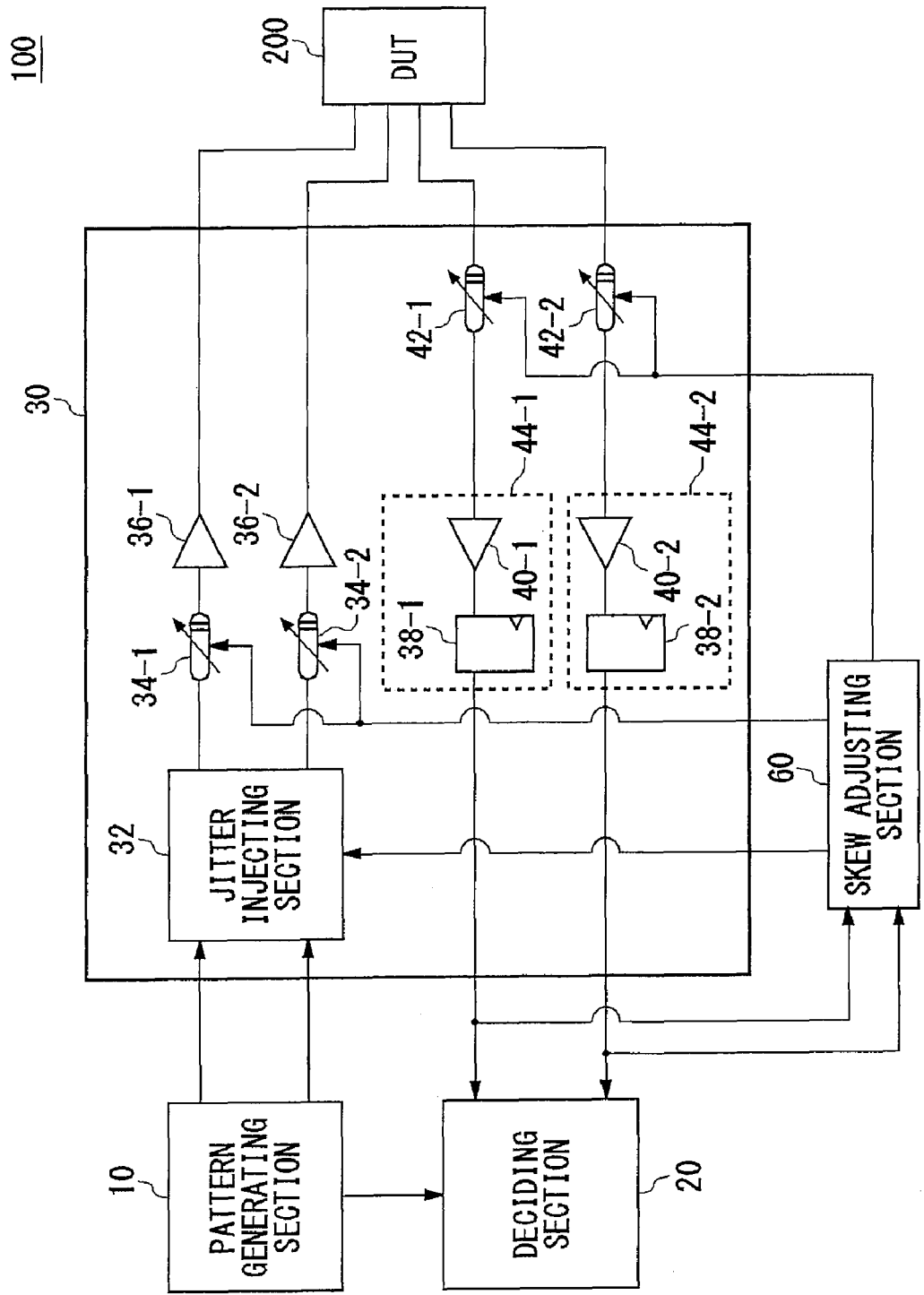
FIG. 1 is a view exemplary showing a configuration of a test apparatus 100 according to an embodiment of the present invention.

FIG. 1 is a view exemplary showing a configuration of a test apparatus 100 according to an embodiment of the present invention. The test apparatus 100 is an apparatus that tests a device under test 200 such as a semiconductor circuit, and includes a pattern generating section 10, a deciding section 20, a driver and comparator section 30, and a skew adjusting section 60. Moreover, the test apparatus 100 may have a socket or the like for mounting thereon the device under test 200.

The skew adjusting section 60 measures and adjusts skews between a plurality of drivers 36 and skews between a plurality of comparators in the driver and comparator section 30. At this time, the skew adjusting section 60 measures a skew by means of an adjustment signal having a previously injected jitter to measure the skew with higher precision. In FIG. 1, a scheme of the test apparatus 100 is explained, and detailed description for skew measurement is described below in FIG. 4.

The pattern generating section 10 generates a test signal having a predetermined logical pattern to be input into the device under test 200. For example, the pattern generating section 10 generates a test signal having a control pattern expected to control the device under test 200 and a test signal having a data pattern to be input into the device under test 200.

The driver and comparator section 30 has a jitter injecting section 32, a plurality of driver-side phase adjusting sections 34, the plurality of drivers 36, a plurality of comparator-side phase adjusting sections 42, and the plurality of comparators 44. The plurality of drivers 36 are respectively provided in correspondence with a plurality of input pins of the device under test 200. Moreover, each of the drivers 36 receives the corresponding test signal from the pattern generating section 10, shapes the received signal in a waveform with a desired signal level, and inputs the shaped signal into the corresponding input pin of the device under test 200.

The plurality of driver-side phase adjusting sections 34 are provided one-to-one corresponding to the plurality of drivers 36. Each of the driver-side phase adjusting sections 34 adjusts an output timing of a test signal in the corresponding driver 36. The plurality of driver-side phase adjusting sections 34 may adjust an output timing of a test signal in the plurality of drivers 36 so that timings at which test signals are input into the device under test 200 are generally same.

For example, the driver-side phase adjusting section 34 may be a variable delay circuit that delays a test signal from the pattern generating section 10 in a delay amount to be set to adjust its phase and inputs the delayed signal into the driver 36. Moreover, when the driver 36 outputs the test signal in accordance with a given clock signal, the driver-side phase adjusting section 34 may delay this clock signal and adjust its phase.

By such a configuration, it is possible to synchronize the plurality of test signals to be input into the device under test 200. Moreover, the jitter injecting section 32 receives the test signal output from the pattern generating section 10, and inputs the test signal having an injected jitter into the driver 36. By such a configuration, for example, it is possible to perform a jitter tolerance test or the like for the device under test 200 by means of a test signal having an injected jitter. However, when the device under test 200 is tested by means of a test signal into which a jitter is not injected, the jitter injecting section 32 may supply the test signal to the driver 36 without injecting a jitter into the test signal from the pattern generating section 10.

The plurality of comparators 44 are respectively provided in correspondence with a plurality of output pins of the device under test 200. Each of the comparators 44 measures a measured signal output from the corresponding output pin at a given sampling clock timing.

The comparator 44 of the present example has a level comparator 40 and a sampling section 38. The level comparator 40 compares a signal level of the measured signal with a preset reference level and outputs a comparison result. For example, the level comparator 40 outputs High logic when a signal level of a measured signal is larger than a reference level and outputs Low logic when the signal level of the measured signal is less than or equal to the reference level.

The sampling section 38 samples a logical value output from the level comparator 40 in accordance with a given sampling clock. The sampling section 38 may be, e.g., a flip-flop that acquires and outputs the logical value output from the level comparator 40 in accordance with the sampling clock.

The plurality of comparator-side phase adjusting sections 42 are provided one-to-one corresponding to the plurality of comparators 44. Each of the comparator-side phase adjusting sections 42 adjusts a measurement timing in the corresponding comparator 44. The plurality of comparator-side phase adjusting sections 42 may adjust measurement timings in the plurality of comparators 44 so that relative phases between measured signals and sampling clocks in the plurality of comparators 44 are generally same.

For example, the comparator-side phase adjusting section 42 may be a variable delay circuit that delays a measured signal from the device under test 200 in a delay amount to be set to adjust its phase and inputs the delayed signal into the level comparator 40. Moreover, the comparator-side phase adjusting section 42 may delay a sampling clock to be given to the sampling section 38 to adjust a phase. By such a configuration, it is possible to synchronize the plurality of measured signals that are measured in the comparator 44.

The deciding section 20 decides a quality of the device under test 200 on the basis of measurement results in the comparators 44. For example, the deciding section 20 may decide a quality of the device under test 200 on the basis of whether a logical value pattern detected by each of the sampling sections 38 and a given expectation pattern are identical with each other. Moreover, the pattern generating section 10 may generate an expectation pattern on the basis of a logical value pattern of a test signal input into the device under test 200.

The skew adjusting section 60 measures skews between the plurality of drivers 36 and skews between the plurality of comparators 44. As described above, the skew adjusting section 60 may measure a skew by means of an adjustment signal having an injected jitter. Moreover, the skew adjusting section 60 controls the driver-side phase adjusting section 34 and the comparator-side phase adjusting section 42 on the basis of the measured skew, in order to adjust the skews between the plurality of drivers 36 and the skews between the plurality of comparators 44.

For example, the skew adjusting section 60 may adjust a delay amount of each of the driver-side phase adjusting sections 34 so as to offset the skews between the drivers 36. Moreover, the skew adjusting section 60 may adjust a delay amount of each of the comparator-side phase adjusting sections 42 so as to offset the skews between the comparators 44.

Moreover, before testing the device under test 200, the skew adjusting section 60 may previously adjust these skews. In this case, the test apparatus 100 may mount a device for calibration in place of the device under test 200. Moreover, when testing jitter tolerance of the device under test 200, the skew adjusting section 60 may also adjust a skew.

Moreover, when measuring the above-described skew, it is preferable that each of the comparators 44 simultaneously measures adjustment signals. Here, the simultaneously measuring includes measuring adjustment signals in a state that a common signal prescribing an output timing of each of the drivers 36 is split and input into each of the drivers 36 and a common sampling clock is split and input into each of the comparators 44.

Figure 2:
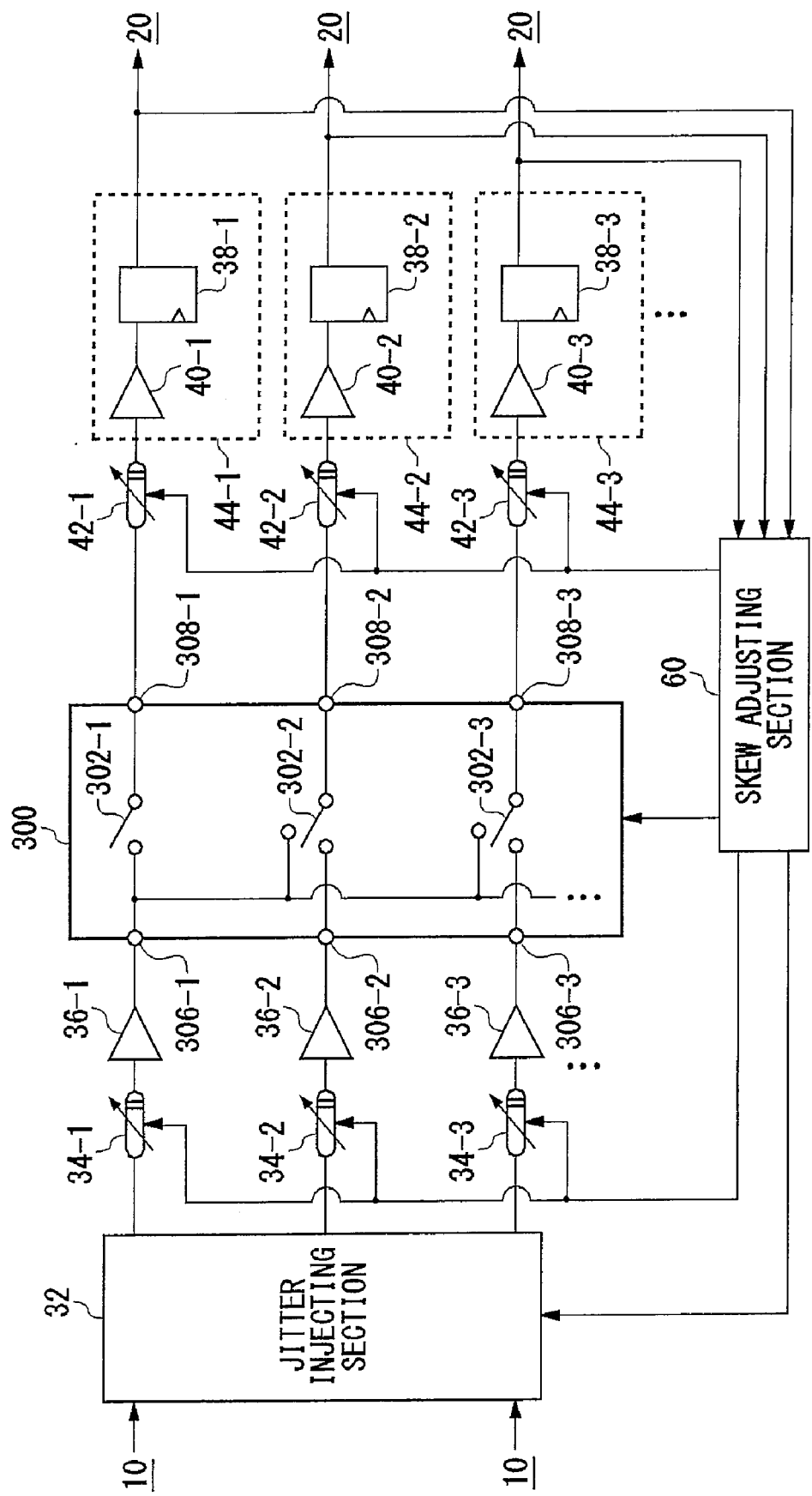
FIG. 2 is a view exemplary showing a configuration of a device for calibration 300.

FIG. 2 is a view exemplary showing a configuration of a device for calibration 300. The device for calibration 300 is a device that is used for measuring at least one skew of skews between the plurality of drivers 36 and skews between the plurality of comparators 44. The device for calibration 300 of the present example has a plurality of input pins 306, a plurality of connection switching sections 302, and a plurality of output pins 308.

The plurality of input pins 306 are provided one-to-one corresponding to the plurality of drivers 36. Each of the input pins 306 receives a signal output from the corresponding driver 36. The plurality of output pins 308 are provided one-to-one corresponding to the plurality of comparators 44. Each of the output pins 308 outputs a signal to the corresponding comparator 44. Moreover, the input pins 306 and the output pins 308 may be provided one-to-one corresponding to each other.

The connection switching sections 302 are respectively provided between the input pins 306 and the output pins 308. Each of the connection switching sections 302 switches whether the corresponding output pin 308 is connected to the corresponding input pin 306 or the predetermined reference input pin 306. In this example, the input pin 306-1 is a reference. In this case, the connection switching section 302-1 corresponding to the reference input pin 306-1 may switch whether the corresponding input pin 306-1 and output pin 308-1 are connected.

When measuring skews between the plurality of comparators 44, each of the connection switching sections 302 connects the corresponding output pin 308 to the reference input pin 306-1. Then, the driver 36-1 outputs a predetermined adjustment signal having a jitter injected by the jitter injecting section 32.

The device for calibration 300 splits and inputs an adjustment signal having an injected jitter into the plurality of comparators 44 via the connection switching section 302. It is preferable that delay amounts of split paths inside the device for calibration 300 are same.

Each of the comparators 44 samples an adjustment signal that is being input. The skew adjusting section 60 measures skews between the plurality of comparators 44 on the basis of a sampling result in each of the comparators 44. The skews between the comparators 44 may be relative phase differences, between the comparators 44, of the adjustment signal or the sampling clock which is input into the comparators 44. This skew, for example, is caused by a transmission delay difference between the comparators 44 from the output pins 308 to the comparators 44 or a phase difference of the sampling clock given to the sampling sections 38 between the comparators 44.

The skew adjusting section 60 controls each of the comparator-side phase adjusting sections 42 to reduce each skew on the basis of the measured skews. For example, the skew adjusting section 60 may measure skews between the first comparator 44-1 and the other comparators 44. Then, the skew adjusting section 60 may adjust a phase of the measured signal or the sampling clock which is input into the corresponding comparator 44 on the basis of each of the measured skews.

Moreover, after adjusting skews between the plurality of comparators 44, the skew adjusting section 60 may adjust skews between the plurality of drivers 36. The skews between the drivers 36 may be caused by output timing differences of a signal between the drivers 36 or transmission delay differences between the drivers 36 from the drivers 36 to the device under test 200 (or the device for calibration 300).

When measuring skews between the plurality of drivers 36, each of the connection switching sections 302 connects the corresponding output pin 308 to the corresponding input pin 306. Then, each of the drivers 36 outputs an adjustment signal having a jitter injected by the jitter injecting section 32 in accordance with the same trigger.

The device for calibration 300 inputs the adjustment signal from the corresponding driver 36 into each of the comparators 44 via the connection switching section 302. It is preferable that delay amounts of paths inside the device for calibration 300 are same.

Each of the comparators 44 samples the adjustment signal that is being input. The skew adjusting section 60 measures the skews between the plurality of drivers 36 on the basis of a sampling result in each of the comparators 44.

The skew adjusting section 60 controls each of the driver-side phase adjusting sections 34 to reduce each skew on the basis of the measured skews. For example, the skew adjusting section 60 may measure skews between the first driver 36-1 and the other drivers 36. Then, the skew adjusting section 60 may adjust a phase of a test signal (an adjustment signal) or an output timing being input into the corresponding driver 36 on the basis of each of the measured skews.

Figure 3:
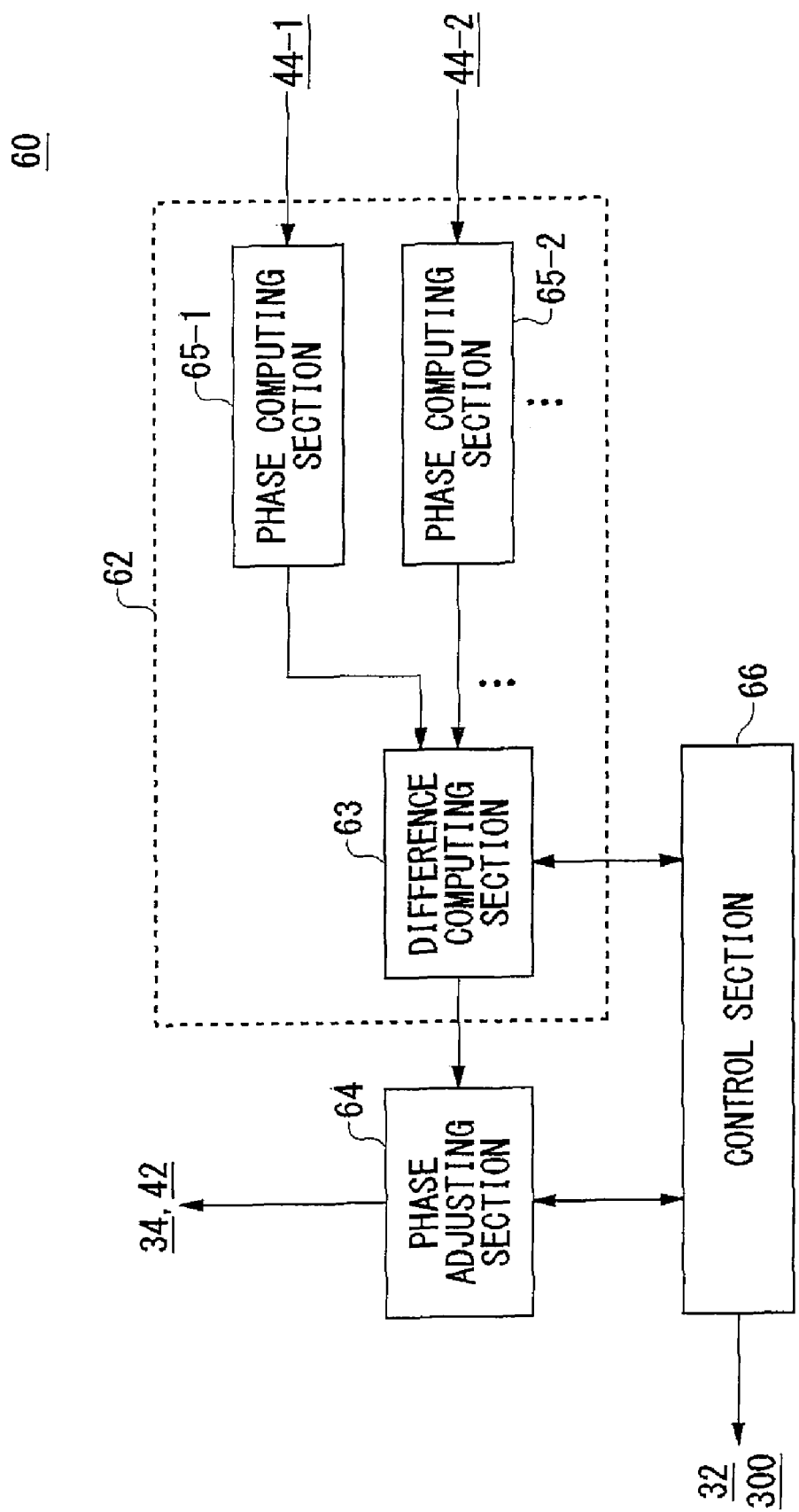
FIG. 3 is a view exemplary showing a configuration of a skew adjusting section 60.

FIG. 3 is a view exemplary showing a configuration of the skew adjusting section 60. The skew adjusting section 60 has a skew computing section 62, a phase adjusting section 64, and a control section 66. When measuring skews between the comparators 44, the control section 66 makes the comparators 44 respectively input an adjustment signal having a previously injected jitter and respectively sample the adjustment signal. As described above, the control section 66 causes the driver 36-1 that is a criterion to output the adjustment signal having a jitter previously injected by the jitter injecting section 32. Moreover, the control section 66 controls each of the connection switching sections 302 of the device for calibration 300 to make each of the comparators 44 split and input this adjustment signal.

The skew computing section 62 receives a sampling result in each of the comparators 44 when the control section 66 has performed the above-described control, and computes the skews between the comparators 44. The control section 66 may inform the skew computing section 62 of the effect that the above-described control has performed.

The skew computing section 62 of the present example has a difference computing section 63 and a plurality of phase computing sections 65. The plurality of phase computing sections 65 may be provided one-to-one corresponding to the plurality of comparators 44. The phase computing section 65 receives a sampling result in the corresponding comparator 44, and computes a phase of the adjustment signal input into the corresponding comparator 44 on the basis of this sampling result.

The difference computing section 63 computes the skews between the comparators 44 on the basis of a difference between the phases each computed from the phase computing sections 65. For example, when computing a skew between the first comparator 44-1 and the second comparator 44-2, the difference computing section 63 may compute a difference between the phases each computed from the first phase computing section 65-1 and the second phase computing section 65-2 corresponding to these comparators 44 as this skew.

The phase adjusting section 64 adjusts a phase of at least any one of the measured signal or the sampling clock to be input into each of the comparators 44 on the basis of the skews computed from the skew computing section 62. For example, when the skew computing section 62 respectively computes skews between the first comparator 44-1 and the other comparators 44, the phase adjusting section 64 may respectively adjust the phases in the other comparators 44 in accordance with each skew.

Moreover, the control section 66 makes each of the drivers 36 output an adjustment signal having the injected jitter when adjusting the skews between the drivers 36 after adjusting the skews between the comparators 44. The skew computing section 62 receives a sampling result in each of the comparators 44 when the control section 66 has performed the above-described control, and computes the skews between the drivers 36.

For example, when computing a skew between the first driver 36-1 and the second driver 36-2, the difference computing section 63 may compute a difference between the phases each computed from the first phase computing section 65-1 and the second phase computing section 65-2 corresponding to these drivers 36 as this skew.

The phase adjusting section 64 adjusts a phase of at least any one of the test signal or the output timing to be input into each of the drivers 36 on the basis of the skews computed from the skew computing section 62. For example, when the skew computing section 62 respectively computes skews between the first driver 36-1 and the other drivers 36, the phase adjusting section 64 may respectively adjust the phases in the other drivers 36 in accordance with each skew.

By a configuration as described above, it is possible to adjust the skews between the plurality of drivers 36 and the skews between the plurality of comparators 44 and thus test the device under test 200 with high precision. Moreover, in the above-described example, the skews between the drivers 36 have been adjusted after adjusting the skews between the comparators 44, but the skews between the comparators 44 are not necessarily adjusted. For example, the skews between the drivers 36 may be adjusted without adjusting the skews between the comparators 44 when the skews between the comparators 44 are small vanishingly.

Figure 4:
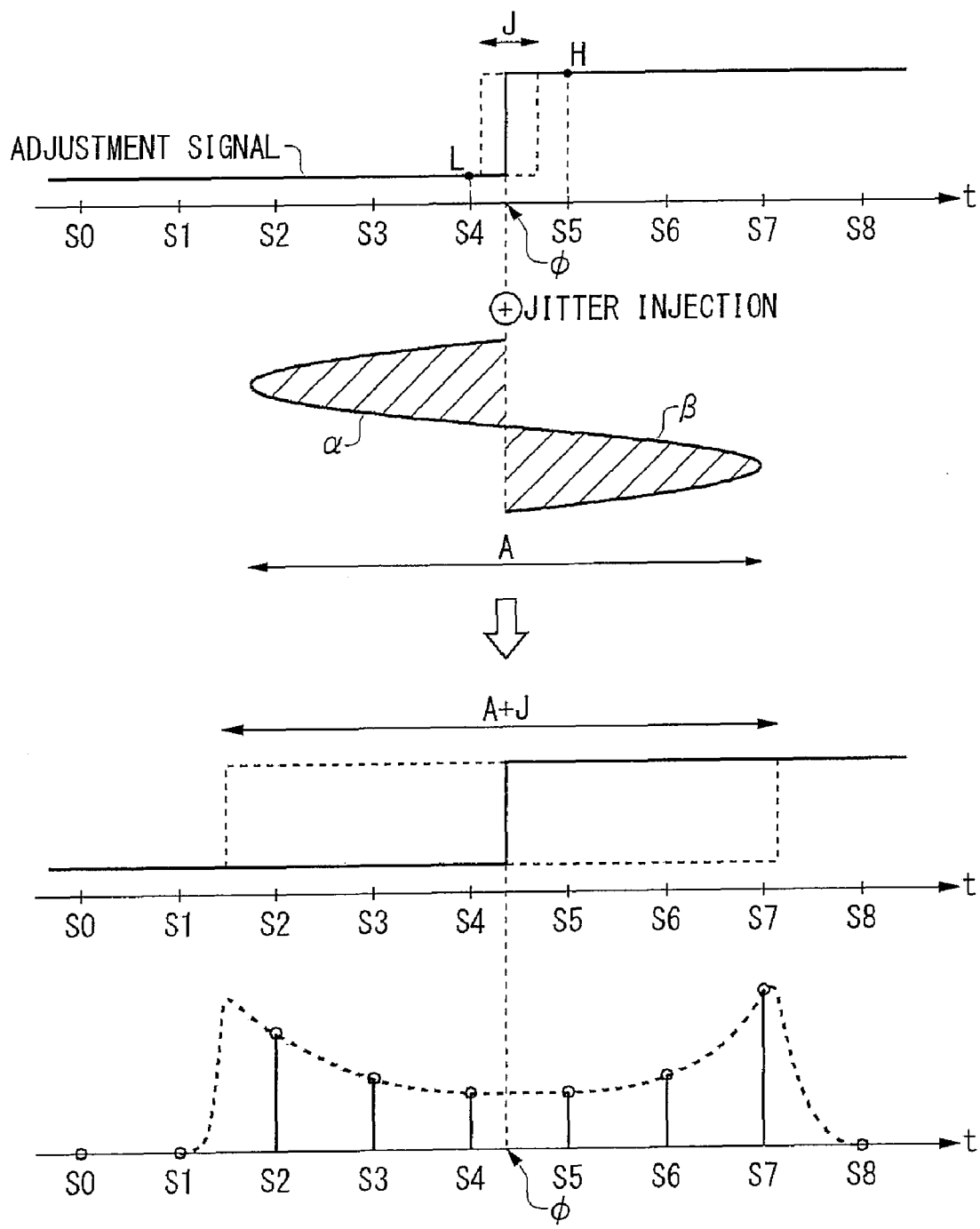
FIG. 4 is a view exemplary explaining an operation of a skew computing section 62.

FIG. 4 is a view exemplary explaining an operation of the skew computing section 62. In this example, it will be explained about when computing the skews between the comparators 44. As described above, the jitter injecting section 32 previously injects a jitter into an adjustment signal. The sampling section 38 samples the adjustment signal at sampling clock timings (S0, S1, S2, . . . ), and outputs a sampling result (L/H) at each timing. In an example of FIG. 4, since a logical value is transited at the timings S4 and S5, it turns out that the adjustment signal has an edge between S4 and S5.

Each of the phase computing sections 65 detects a position of the edge of the adjustment signal as a phase $\phi$ of the adjustment signal. Here, a determinative jitter J is injected into the adjustment signal in a signal generation circuit, a transmission route, and so on. For this reason, the phase computing section 65 may compute a mean value of edge positions at each cycle of the adjustment signal as the phase $\phi$ of the adjustment signal.

In addition, an interval (a period of the adjustment signal) of each cycle of the adjustment signal may be previously given to the phase computing section 65 by a user or the like. The mean value of edge positions can be obtained from a distribution of the sampling clock timings at which transitions of the logical values output from the sampling section 38 are detected.

For example, as shown in FIG. 4, it is considered that a sampling is repeated by N cycles at the timings of (S0, S1, S2, . . . ). At this time, it is assumed that cycles are N/2 times, in which the logical value output from the sampling section 38 transits to Low logic at the timing of S3 and to High logic at the timing of S4. Similarly, it is assumed that cycles are N/2 times, in which the logical value output from the sampling section 38 transits to Low logic at the timing of S4 and to High logic at the timing of S5. In this case, the phase computing section 65 may compute the timing of S4 as the phase $\phi$ of the adjustment signal.

However, for example, as shown in FIG. 4, when an amplitude of the jitter J injected into the adjustment signal is smaller than an interval of the sampling clock, a timing at which the logical value output from the sampling section 38 transits may be S5 in all cycles of the adjustment signal. In this case, it cannot be computed which position between S4 and S5 is a mean value of edge positions of the adjustment signal.

On the contrary, the test apparatus 100 injects a predetermined jitter into the adjustment signal as shown in FIG. 4 in the jitter injecting section 32, in order to detect an edge position of the adjustment signal with higher precision. For example, it is preferable that the jitter injecting section 32 injects a jitter of which an amplitude A is larger than a period (an interval of S0, S1, S2, . . . ) of the sampling clock.

Moreover, it is preferable that the jitter injecting section 32 injects a jitter in which a mean value of sine wave jitters, random (Gaussian) jitters, or the like becomes substantially zero. For example, the jitter injecting section 10 may inject a jitter in which a distribution A of jitter components delaying the phase of the edge of the measured signal and a distribution B of advancing jitter components become substantially symmetric. Moreover, for example, the jitter injecting section 32 may inject a jitter in which a jitter waveform $\alpha$ with a component delaying the phase of the edge of the adjustment signal and a jitter waveform $\beta$ with an advancing component become substantially symmetric. Moreover, the jitter injecting section 32 may inject a jitter in which the jitter waveform $\alpha$ and the jitter waveform $\beta$ alternately appear.

By such a process, a jitter having an amplitude of A+J is injected into the adjustment signal input into the sampling section 38. In addition, as described above, since a mean value of the jitters injected by the jitter injecting section 32 is substantially zero, a mean value of edge positions of the adjustment signal does not vary.

The sampling section 38 samples an adjustment signal into which a jitter having the amplitude of A+J is injected. Since the amplitude A+J in a time direction is large than the period of the sampling clock, the transition of the logical value is detected over the plurality of timings of the sampling clock.

The phase computing section 65 may detect timings at which the logical value output from the sampling section 38 transits every cycle of the adjustment signal. Moreover, the phase computing section 65 may compute a distribution of the timings and compute the phase of the adjustment signal from this distribution.

For example, when the jitter injecting section 32 injects a sine wave jitter, in a distribution computed from the phase computing section 65, a frequency in an edge position of the adjustment signal becomes smallest as shown in FIG. 4. When the computed distribution approximates to a curved line, the phase computing section 65 may detect a timing at which a frequency becomes smallest as an edge position of the adjustment signal.

As described above, the test apparatus 100 can measure a phase of an adjustment signal to be input into each comparator 44 with high precision. In other words, by injecting a jitter into an adjustment signal, it is possible to improve a resolution in a time direction compared with an interval of a sampling clock in order to measure an edge position of the adjustment signal. For this reason, even when using the sampling section 38 of which a resolution in an amplitude direction is one bit, the phase of the adjustment signal can be measured with high precision.

Therefore, the skew adjusting section 60 can measure the skews between the drivers 36 and the skews between the comparators 44 with high precision and also adjust these skews with high precision. For this reason, it is possible to test the device under test 200 with high precision.

Figure 5:
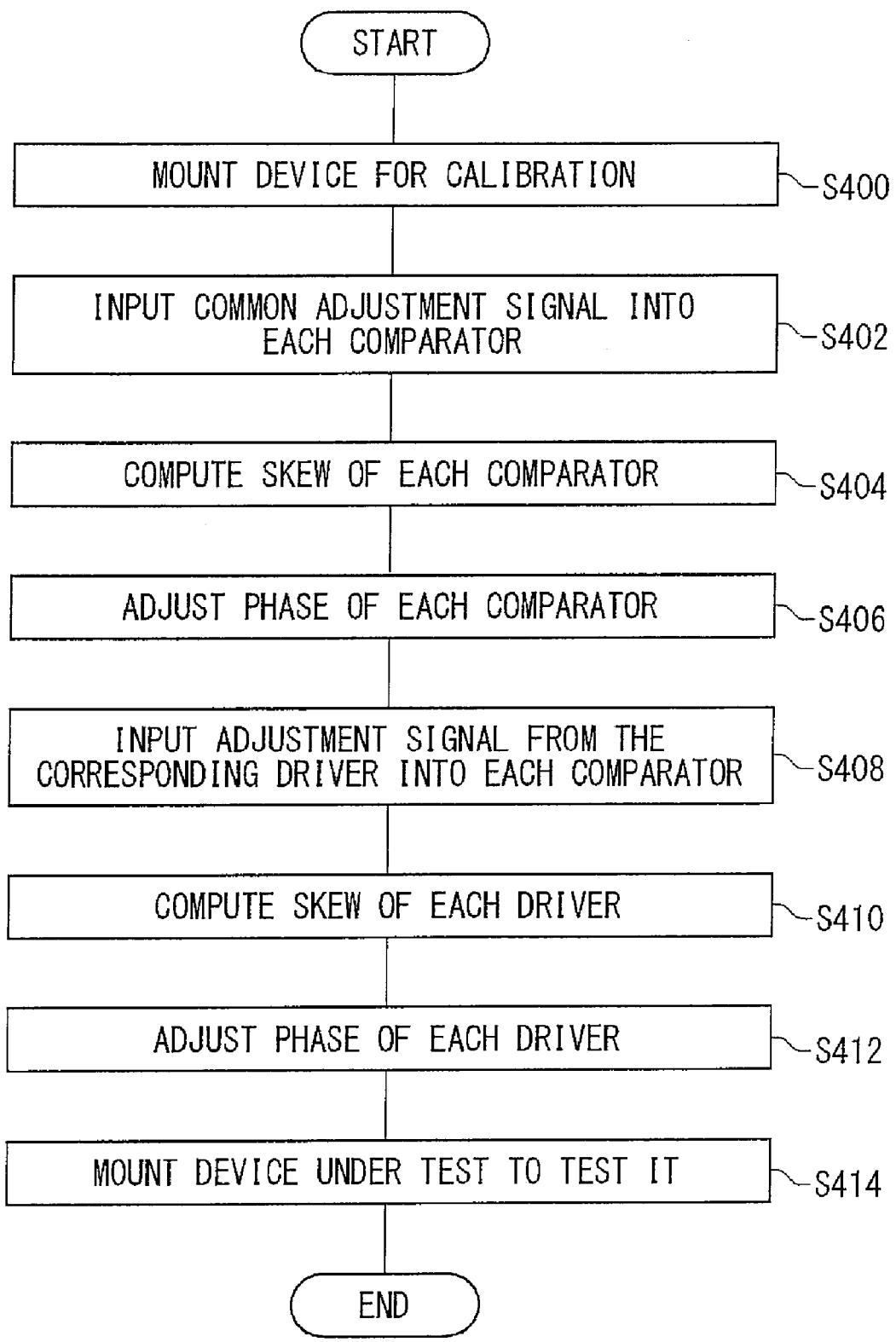
FIG. 5 is a flowchart exemplary showing an operation of a test apparatus 100.

FIG. 5 is a flowchart exemplary showing an operation of the test apparatus 100. The test apparatus 100 of the present example tests the device under test 200 after previously performing the adjustment for skews.

First, the test apparatus 100 mounts thereon the device for calibration 300. Then, a common adjustment signal having a jitter injected by the jitter injecting section 32 is input into each comparator 44 (S402) in order to measure a phase of an adjustment signal to be input into each comparator 44.

Next, skews between each comparator 44 are computed on the basis of a measurement result in each comparator 44 (S404). Then, a phase in each comparator 44 is adjusted on the basis of the computed skews (S406). According to this, the skews between each comparator 44 can be reduced.

Next, the adjustment signal having the injected jitter is output from each driver 36 and is input into the corresponding comparator 44 (S408). Then, on the basis of the measurement result in each comparator 44, the skews between the drivers 36 are computed (S410). Then, on the basis of the computed skews, the phase in each driver 36 is adjusted (S412). According to this, the skews between the drivers 36 can be reduced.

After adjusting the skews between the comparators 44 and the skews between the drivers 36, the device under test 200 is mounted in place of the device for calibration 300 to perform a test (S414). By such an operation, it is possible to test the device under test 200 with high precision.

Figure 6:
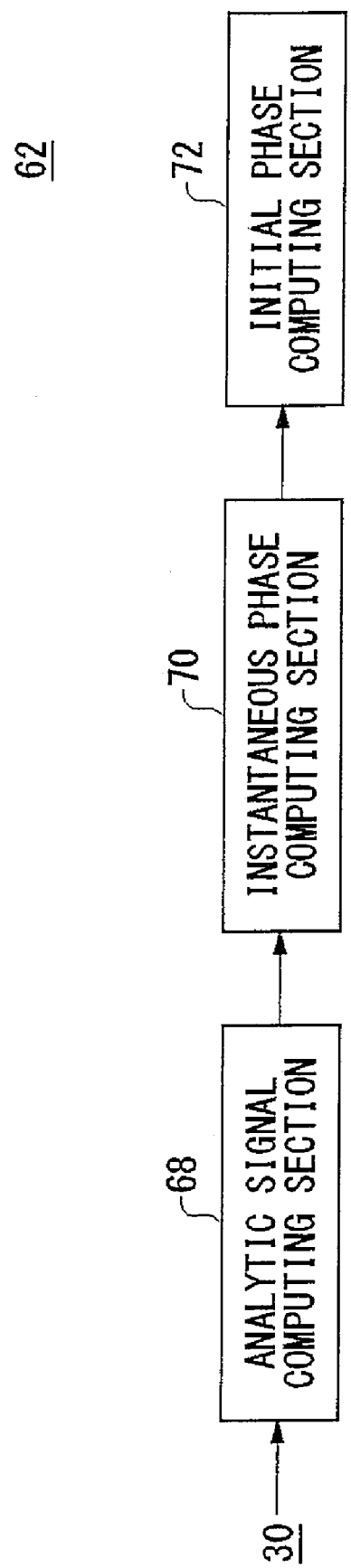
FIG. 6 is a view exemplary showing a configuration of a phase computing section 65.

FIG. 6 is a view exemplary showing a configuration of the phase computing section 65. The phase computing section 65 of the present example computes the phase of the adjustment signal by using an analytic signal without obtaining a distribution as described with reference to FIG. 2.

The phase computing section 65 has an analytic signal computing section 68, an instantaneous phase computing section 70, and an initial phase computing section 72. The analytic signal computing section 68 computes an analytic signal of the adjustment signal from the sampling result in the sampling section 38.

Figure 7:
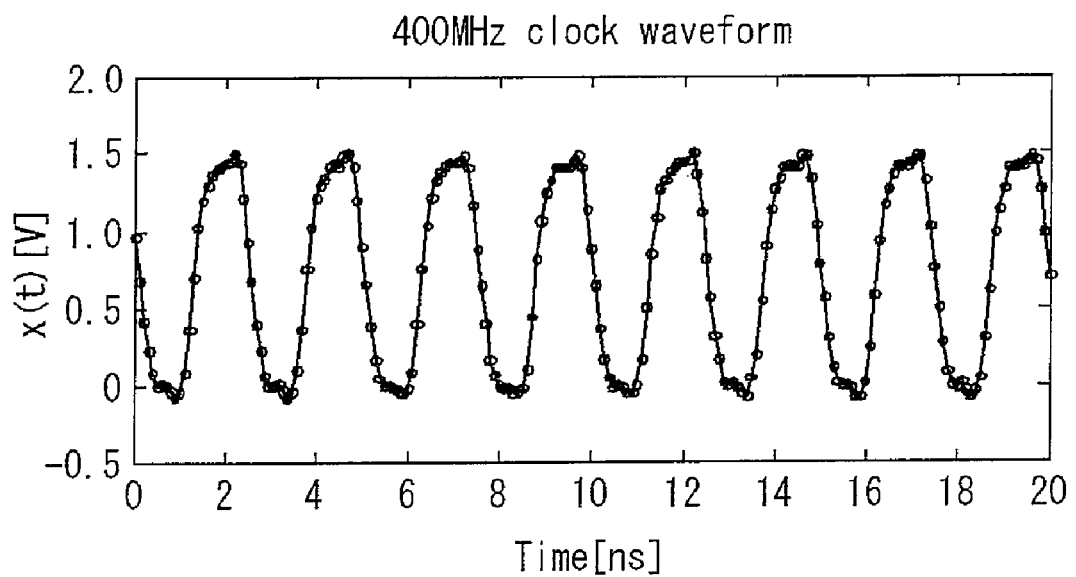
FIG. 7 is a view exemplary showing a sampling result in a sampling section 38.

FIG. 7 is a view exemplary showing a sampling result in the sampling section 38. The analytic signal computing section 68 may perform Fourier transform on this sampling result to compute a complex spectroscopic signal.

Figure 8:
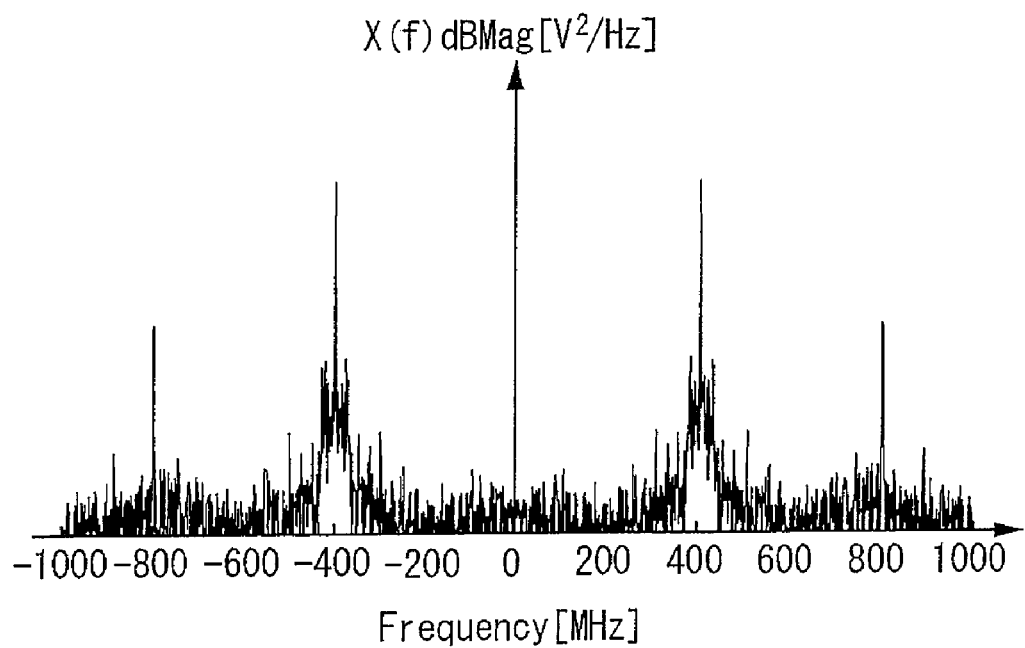
FIG. 8 is a view exemplary showing a complex spectroscopic signal computed from an analytic signal computing section 68.

FIG. 8 is a view exemplary showing a complex spectroscopic signal computed from the analytic signal computing section 68. The analytic signal computing section 68 may extract a fundamental frequency component of the adjustment signal in this complex spectroscopic signal.

Figure 9:
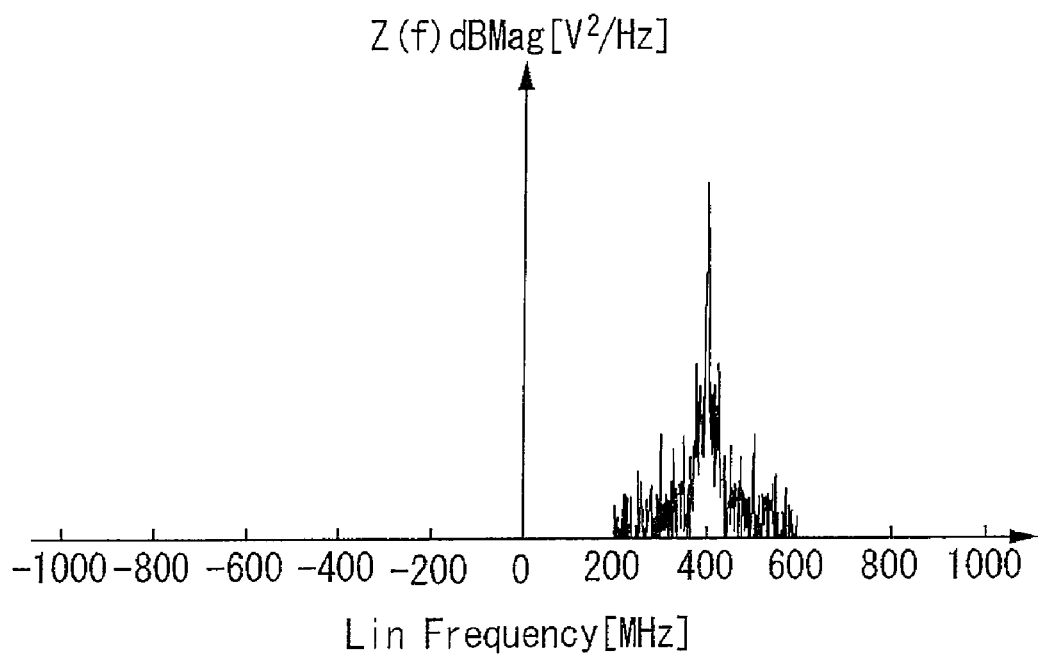
FIG. 9 is a view exemplary showing a fundamental frequency component extracted from an analytic signal computing section 68.

FIG. 9 is a view exemplary showing a fundamental frequency component extracted from the analytic signal computing section 68. As shown in FIG. 9, the fundamental frequency component of the adjustment signal may be a component within a predetermined frequency range centering on a carrier frequency of the adjustment signal in the complex spectroscopic signal. The width of this frequency range may be substantially same as a value of the carrier frequency. The analytic signal computing section 68 may compute the analytic signal of the adjustment signal by performing Fourier inverse transform on the extracted fundamental frequency component.

Figure 10:
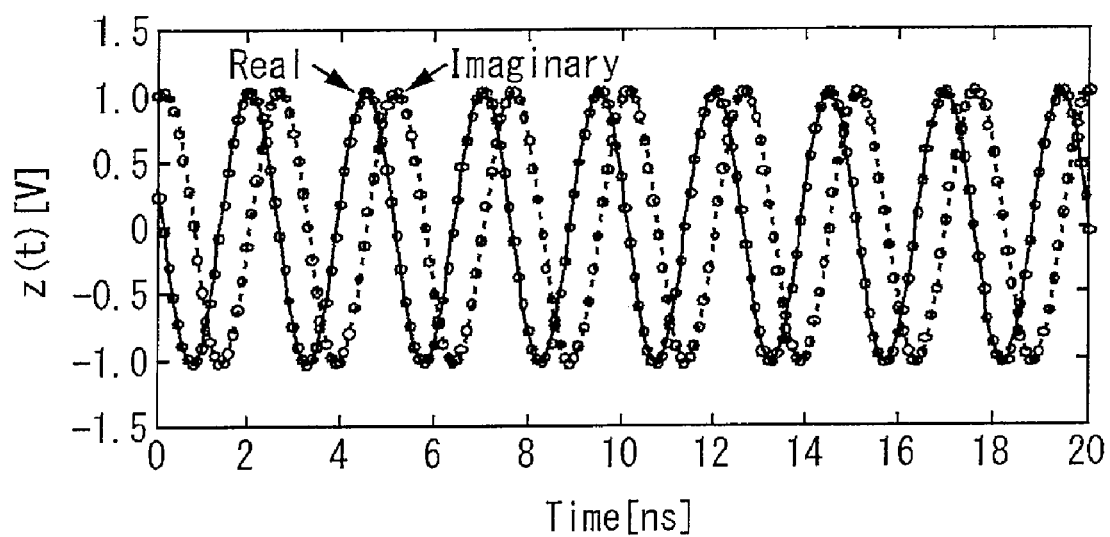
FIG. 10 is a view exemplary showing an analytic signal computed from an analytic signal computing section 68.

FIG. 10 is a view exemplary showing an analytic signal computed from the analytic signal computing section 68. As shown in FIG. 10, the analytic signal may be a signal in which a waveform of the adjustment signal is a real part and a waveform obtained by delaying the phase of the adjustment signal by 90 degrees is an imaginary part. Moreover, the analytic signal computing section 68 may generate a Hilbert transform pair of the adjustment signal to compute the analytic signal from the measured signal and its Hilbert transform.

By a process as described above, it is possible to compute an analytic signal of an adjustment signal. In addition, the sampling section 38 shown in FIG. 10 has a resolution of several bits in an amplitude direction, but an analytic signal can be similarly generated even in the case of a sampling result in the sampling section 38 with one-bit resolution.

The instantaneous phase computing section 70 computes an instantaneous phase of the adjustment signal on the basis of the analytic signal computed from the analytic signal computing section 68. For example, the instantaneous phase computing section 70 may compute the instantaneous phase of the adjustment signal by obtaining an inverse tangent of a real part and an imaginary part of the analytic signal.

Here, a function of the instantaneous phase obtained from the inverse tangent of the real part and the imaginary part of the analytic signal is expressed with, e.g., principal values within a range between $-\pi$ and $\pi$. In other words, this function is a discontinuous function in which a next value of $\pi$ becomes $-\pi$. In this case, the analytic signal computing section 68 may unwrap a phase of the instantaneous phase, e.g., by sequentially adding $2\pi$ to discontinuous points in a function for the instantaneous phase, in order to compute a continuous instantaneous phase.

Figure 11:
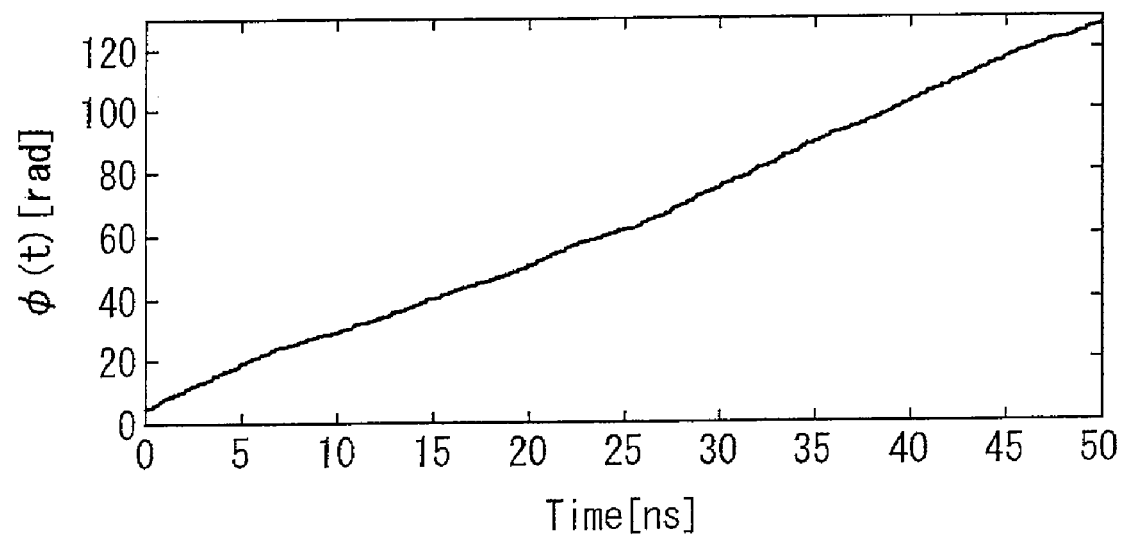
FIG. 11 is a view exemplary showing a waveform of an instantaneous phase obtained by unwrapping a phase.

FIG. 11 is a view exemplary showing a waveform of an instantaneous phase obtained by unwrapping a phase. As shown in FIG. 11, it is possible to obtain a continuous instantaneous phase by unwrapping a phase.

The initial phase computing section 72 computes an initial phase angle of the adjustment signal on the basis of the waveform of the instantaneous phase computed from the instantaneous phase computing section 70. For example, the initial phase computing section 72 may compute an initial phase $\phi_0$ such that a waveform data $\phi(k)$ of the instantaneous phase and a squared error of a straight line $\omega \cdot k + \phi_0$ are the minimum.

In other words, the initial phase computing section 72 may compute the initial phase $\phi_0$ in which Expression (1) becomes the minimum.

$$\sum_{k=1}^{N}(\phi(k) - (\omega \cdot k + \phi_0))^2 \qquad \text{Expression (1)}$$

At this time, the initial phase $\phi_0$ is given by, e.g., the following Expression.

$$\phi_0 = \frac{2N(2N+1)\sum_{k=1}^{N}\phi(k) - 6\sum_{k=1}^{N}k\phi(k)}{N(N-1)} \qquad \text{Expression (2)}$$

An estimation of a parameter by straight-line fitting as described above is disclosed in Reference Document 3. Reference Document 3 is "Analysis and Measurement Procedure, 2nd ed., p. 362, J. S. Bendat and A. G. Piersol, John Wiley & Sons, Inc., 1986".

As described above, it is possible to compute an analytic signal from a sampling result in the sampling section 38, compute an instantaneous phase from the analytic signal, and further obtain an initial phase of the instantaneous phase, in order to compute the phase of the adjustment signal. In addition, the instantaneous phase $\phi(k)$ includes an ideal straight-line component $\omega \cdot k + \phi_0$ and a component (a timing jitter) $\Delta\phi(k)$ of instantaneous phase noises. For this reason, it is preferable that the measurement is performed with a measurement resolution with which information of a mean value of the instantaneous phase noises $\Delta\phi(k)$ of the adjustment signal is preserved with constant precision in order to precisely compute the initial phase $\phi_0$ of the adjustment signal from the sampling result.

Figure 12A:
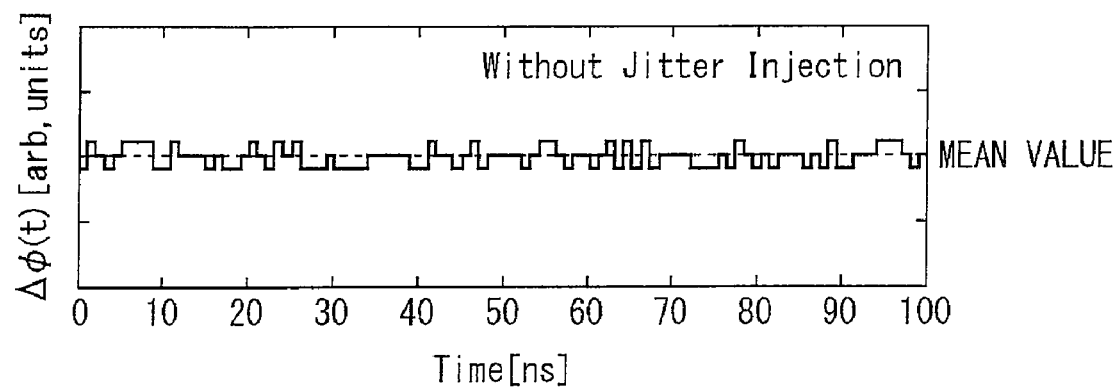
FIG. 12A is a view exemplary showing a waveform of an instantaneous phase noise $\Delta\phi(t)$ of an adjustment signal not having a jitter injected by a jitter injecting section 32.
Figure 12B:
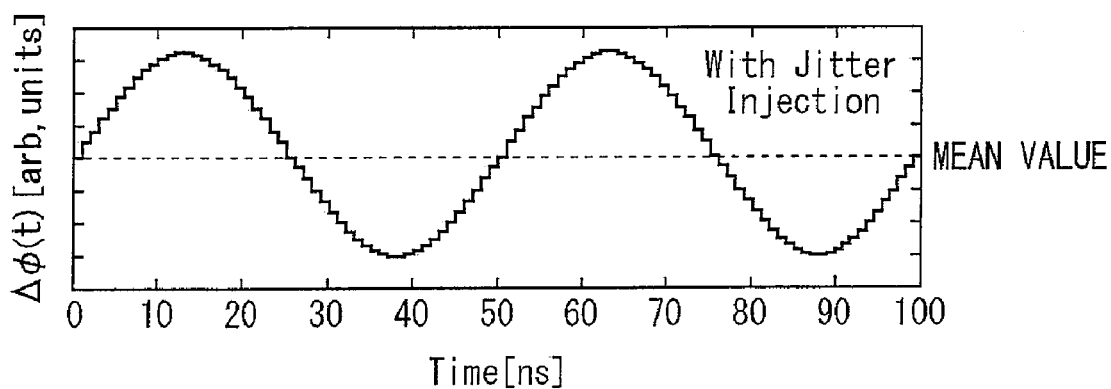
FIG. 12B is a view exemplary showing a waveform of an instantaneous phase noise $\Delta\phi(t)$ of an adjustment signal having a jitter injected by a jitter injecting section 32.

FIG. 12A is a view exemplary showing a waveform of instantaneous phase noises $\Delta\phi(t)$ of an adjustment signal not having a jitter injected by the jitter injecting section 32. FIG. 12B is a view exemplary showing a waveform of instantaneous phase noises $\Delta\phi(t)$ of an adjustment signal having a jitter injected by the jitter injecting section 32. In addition, the instantaneous phase noises $\Delta\phi(t)$ shown in FIGS. 12A and 12B may be a waveform which is obtained by subtracting the straight-line component $\omega \cdot t + \phi_0$ from the instantaneous phase $\phi(t)$ shown in FIG. 11.

Generally, the instantaneous phase noises $\Delta\phi(t)$ included in a signal varies continuously. However, when performing a signal processing in a digital method like the skew adjusting section 60, there may not be obtained a measurement resolution sufficient to deal with the instantaneous phase noises as a continuous object. In such a measurement environment, as shown in FIG. 12A, even when the instantaneous phase noises are computed, there is obtained a waveform varying in a discontinuous manner with a coarse resolution. For this reason, information of a mean value of the instantaneous phase noises degrades, and estimated precision of an initial phase decreases.

On the contrary, it is possible to obtain a sampling result including waveform information of more continuous instantaneous phase noises as shown in FIG. 12B by injecting and measuring a jitter by the jitter injecting section 32. The concerning sampling result preserves information of a mean value of instantaneous phase noises with high precision similarly to an example described with reference to FIG. 4. For this reason, it is possible to obtain the initial phase $\phi_0$ with high precision by obtaining the initial phase $\phi_0$ from the concerned sampling result as described above.

Moreover, the phase computing section 65 may extract a carrier frequency component of the adjustment signal from a complex spectroscopic signal as shown in FIG. 8 and compute a phase angle of the carrier frequency component. The phase angle of the carrier frequency component can be obtained from an inverse tangent of a real part and an imaginary part of the carrier frequency component.

Since the phase of the adjustment signal largely depends on the phase angle of the carrier frequency component, a phase can be computed with high precision also when the phase of the adjustment signal is computed from the phase angle of the carrier frequency component.

As described in reference to FIGS. 1 to 12, the respective phase computing sections 65 compute a mean value of edge positions of the adjustment signal as the phase of the adjustment signal. For this reason, the skew computed from the skew computing section 62 corresponds to a determinative skew between the adjustment signals. A determinative skew is a skew which is uniquely determined from a characteristic of a transmission route or the like of the adjustment signal and does not include a random (irregular) skew component. A determinative skew is obtained by a difference between mean values of edge positions of two signals as described above.

Figure 13:
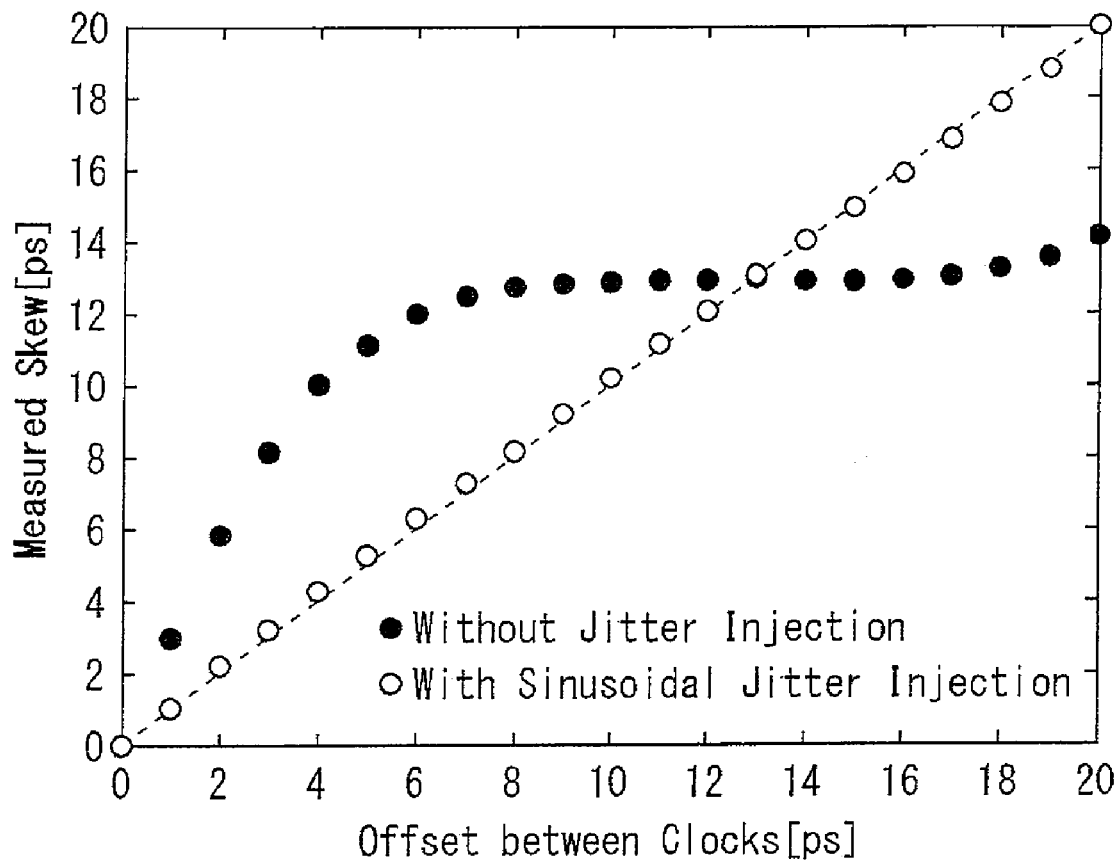
FIG. 13 is a view exemplary showing skews measured by a skew computing section 62.

FIG. 13 is a view exemplary showing a skew measured by the skew computing section 62. In FIG. 13, a result obtained by inputting and measuring a jitter by the jitter injecting section 32 is shown with white circles. Moreover, a measured result without injecting a jitter by the jitter injecting section 32 is shown with black circles. Moreover, in FIG. 13, a horizontal axis shows a true value of a skew between the adjustment signals and a vertical axis shows a value of the measured skew.

Moreover, a frequency of the adjustment signal of the present example is 1.5 GHz, a frequency of the sampling clock is 6.48 GHz, and a resolution of the sampling section 38 in an amplitude direction is one bit. Moreover, a sine wave jitter of which amplitude is substantially same as a unit interval (a period) of the adjustment signal and a frequency is 1 MHz is input into the jitter injecting section 32. Under this condition, the skew between the adjustment signals are measured while changing it by 1 ps between 0 ps and 20 ps.

As shown in FIG. 13, the generally same value is measured for a true value of a skew in a constant range when not injecting a jitter. As shown in FIG. 4, although a phase of one adjustment signal is shifted in a constant range to change the skew, the reason is that the change of skew cannot be detected because a measurement resolution in amplitude direction and time direction is coarse. As shown in FIG. 13, the measurement error when not injecting a jitter is about 6 ps at a maximum.

On the contrary, there is obtained a measurement result with a small error compared with a true value shown with a dotted line of FIG. 13 when injecting a jitter by the jitter injecting section 32. The measurement error in this case is about 0.3 ps at a maximum. From the concerned experiment results, it can be understood that measurement accuracy is improved by injecting the jitter into the adjustment signal by the jitter injecting section 32.

Hereinbefore, it is assumed that the corresponding edges of two adjustment signals do not depart from each other more than one period. Hereinafter, it will be explained about an operation example of the skew computing section 62 when the corresponding edges of two adjustment signals depart from each other more than one period.

Figure 14:
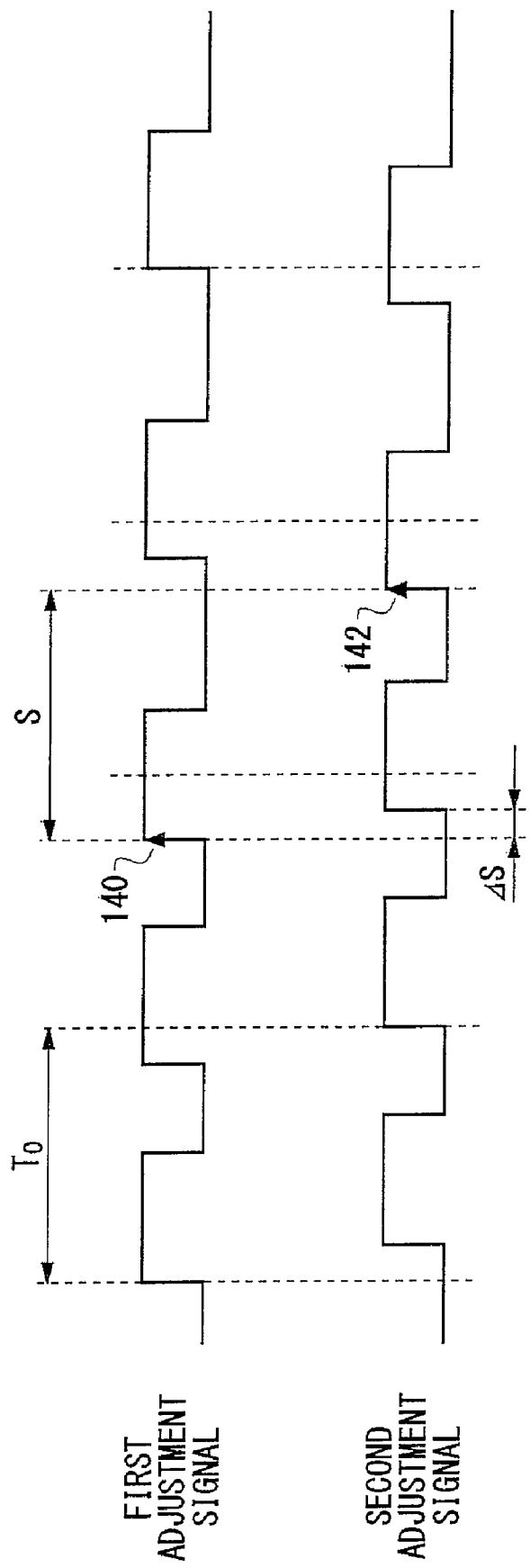
FIG. 14 is a view exemplary showing two adjustment signals.

FIG. 14 is a view exemplary showing two adjustment signals. In FIG. 14, an edge 140 of a first adjustment signal and an edge 142 of a second adjustment signal correspond to each other. For example, the edge 140 and the edge 142 are edges transmitted at the same timing, but it is assumed that a skew larger than a period $T_0$ of the adjustment signal is generated due to a transmission delay or the like.

In this case, the skew computing section 62 should compute a mean value of the skews S as a determinative skew. However, the skew computing section 62 described with reference to FIGS. 1 to 13 computes a difference between a mean value of edge positions of the first adjustment signal and a mean value of edge positions of the second adjustment signal as a determinative skew. For this reason, the computed skew becomes a mean value of $\Delta S$ of a smaller component than the period $T_0$ by excluding a component of an integral multiple of the period $T_0$ of the adjustment signal.

Figure 15:
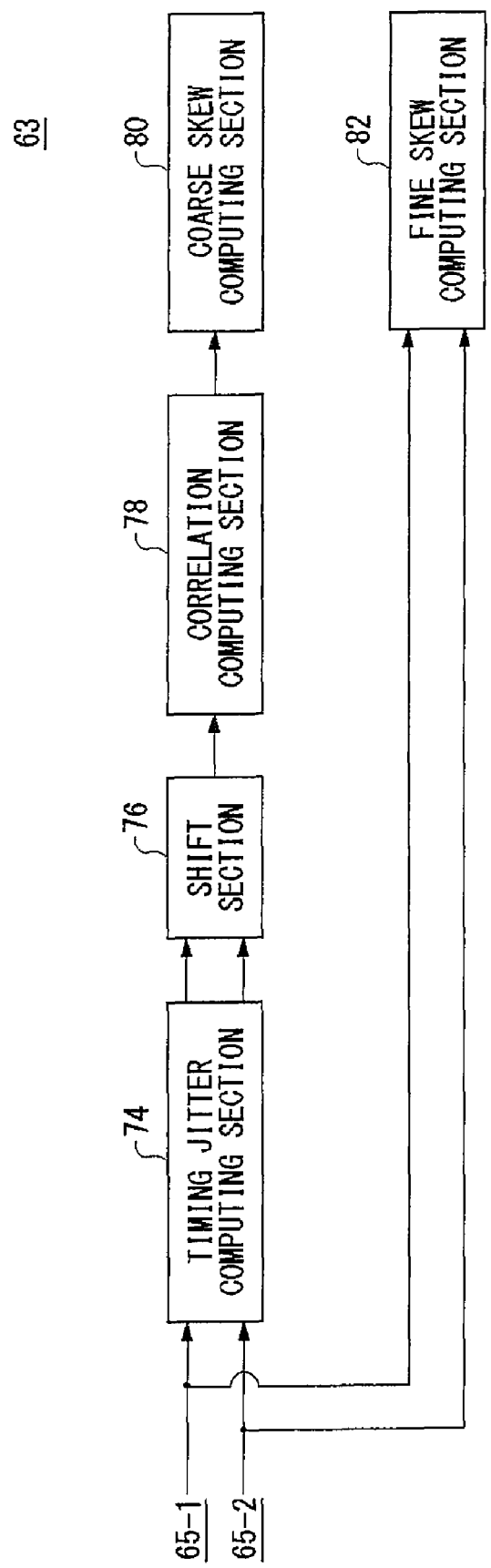
FIG. 15 is a view exemplary showing a configuration of a difference computing section 63.

FIG. 15 is a view exemplary showing a configuration of the difference computing section 63. The difference computing section 63 of the present example also computes a skew larger than the period $T_0$ of the adjustment signal as described above. Moreover, the first and the second adjustment signals of the present example are generated in synchronization with the same reference signal. The difference computing section 63 has a timing jitter computing section 74, a shift section 76, a correlation computing section 78, a coarse skew computing section 80, and a fine skew computing section 82.

The fine skew computing section 82 computes a smaller component than the period $T_0$ of the adjustment signal from a difference between the phases computed from the first phase computing section 65-1 and the second phase computing section 65-2, similarly to the skew computing section 62 described with reference to FIGS. 1 to 14.

The timing jitter computing section 74 respectively receives the instantaneous phase $\phi(t)$ computed from the instantaneous phase computing section 70 from the first phase computing section 65-1 and the second phase computing section 65-2. The timing jitter computing section 74 computes a timing jitter sequence $\Delta\phi(n)$ of each adjustment signal from each instantaneous phase $\phi(t)$.

For example, the timing jitter computing section 74 may subtract a straight line obtained by straight-line fitting the instantaneous phase $\phi(t)$ from the instantaneous phase $\phi(t)$, in order to compute the instantaneous phase noises $\Delta\phi(t)$. Then, it may sample the instantaneous phase noises $\Delta\phi(t)$ at a zero cross timing of a real part of the corresponding analytic signal in order to compute the timing jitter sequence $\Delta\phi(n)$.

Figure 16:
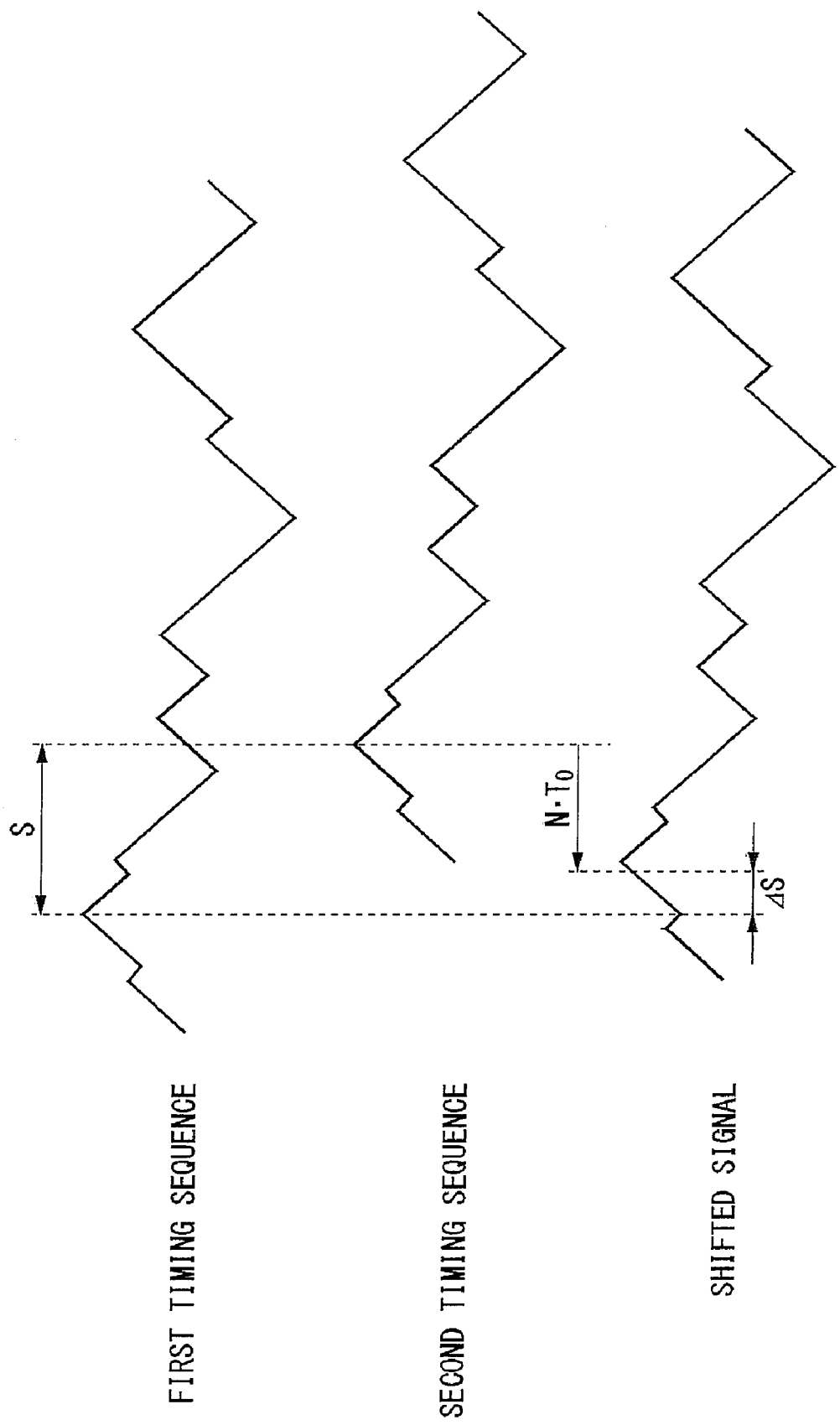
FIG. 16 is a view exemplary showing a first and a second timing jitter sequences of a first and a second adjustment signals.

FIG. 16 is a view exemplary showing a first and a second timing jitter sequences of a first and a second adjustment signals. Since the first and the second adjustment signals of the present example are generated in synchronization with the same reference signal, a jitter of a reference signal is similarly injected into the first and the second adjustment signals. For this reason, the timing jitter sequences $\Delta\phi(n)$ of the first and the second adjustment signals become a similar waveform and has a phase difference according to the skew S.

The shift section 76 shown in FIG. 15 sequentially shifts a timing of at least any one side of the first timing jitter sequence and the second timing jitter sequence in a shift amount of an integral multiple of the period $T_0$ of the first and the second adjustment signals. The shift section 76 of the present example shifts a timing of the second timing jitter sequence $\Delta\phi(n)$ in a shift amount of N (here, N is an integer number), and sequentially changes N.

The correlation computing section 78 computes a correlation value between the first timing jitter sequence and the second timing jitter sequence for each shift amount (or every N) in the shift section 76. For example, the correlation computing section 78 may compute a cross-correlation function between the first timing jitter sequence and the second timing jitter sequence.

The coarse skew computing section 80 detects a shift amount in which a correlation computed from the correlation computing section 78 becomes the maximum, and computes a component $N\cdot T_0$ of an integral multiple of a period of the first adjustment signal and the second adjustment signal in the skew of the first adjustment signal and the second adjustment signal on the basis of the detected shift amount. The coarse skew computing section 80 may compute a shift amount in which a correlation is the maximum as a skew of an integral multiple of a period.

By such a process, a component $N\cdot T_0$ of an integral multiple of a period of the first adjustment signal and the second adjustment signal and a component $\Delta S$ smaller than the period of the first adjustment signal and the second adjustment signal can be computed in the skew of the first adjustment signal and the second adjustment signal. The skew computing section 62 may add the value computed from the coarse skew computing section 80 and the value computed from the fine skew computing section 82 to compute a total value of the skews.

In addition, it is preferable that the jitters injected into the adjustment signals by the jitter injecting section 32 are the same. However, it is not limited to the same jitter. Moreover, when measuring a skew, a mean value of the jitters injected by the jitter injecting section 32 may not be zero when injecting the same jitter into each of the adjustment signals.

Figure 17:
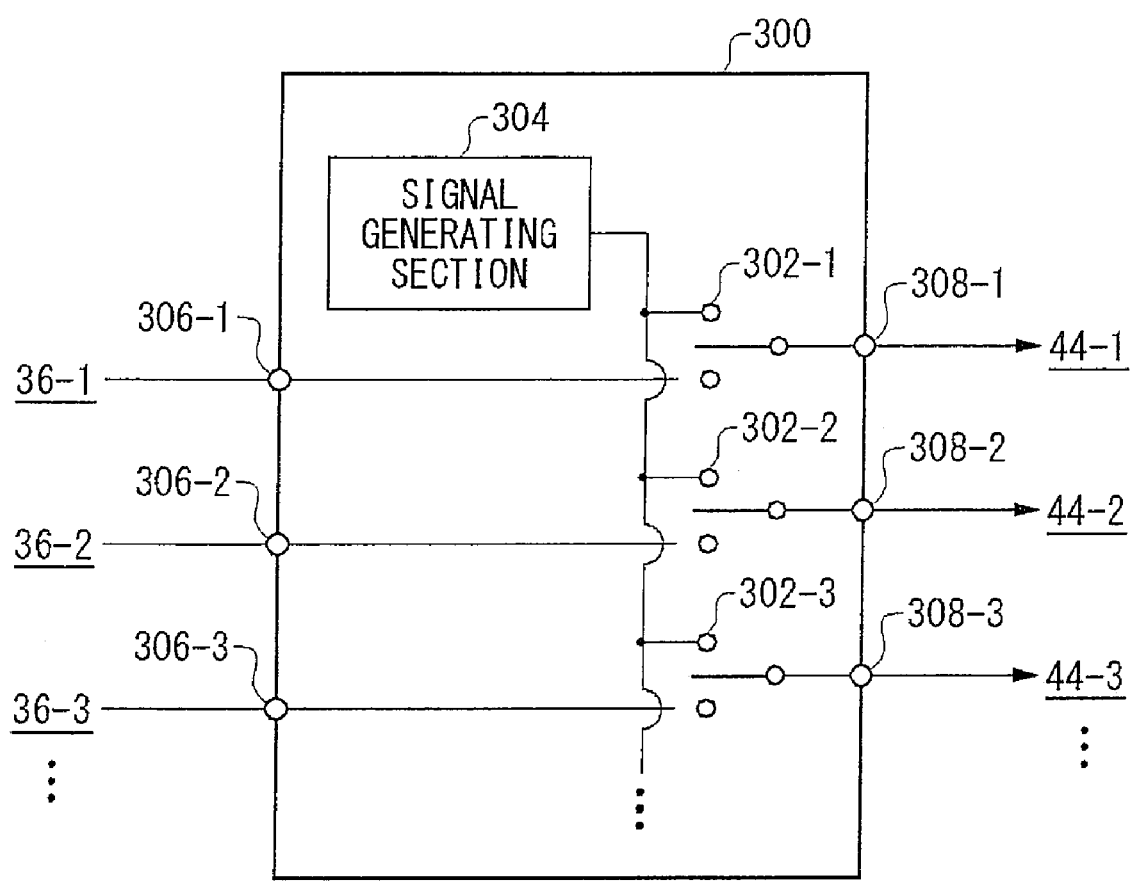
FIG. 17 is a view showing another configuration example of a device for calibration 300.

FIG. 17 is a view showing another configuration example of the device for calibration 300. The device for calibration 300 of the present example further includes a signal generating section 304 in addition to the configuration of the device for calibration 300 described with reference to FIG. 2.

The signal generating section 304 generates an adjustment signal having an injected jitter. For example, when being notified of the effect that the skews between the comparators 44 are measured from the skew adjusting section 60, the signal generating section 304 may generate an adjustment signal into which a jitter similar to the jitter injected by the jitter injecting section 32 is injected.

Each of the connection switching sections 302 switches whether the corresponding output pin 308 is connected to the corresponding input pin 3.06 or not the signal generating section 304. When measuring the skews between the plurality of comparators 44, each of the connection switching sections 302 connects the corresponding output pin 308 to the signal generating section 304. When measuring the skews between the comparators 44 by means of the device for calibration 300 of the present example, it may not cause the driver 36 to output an adjustment signal.

Moreover, when measuring the skews between the drivers 36, each of the connection switching sections 302 connects the corresponding output pin 308 to the corresponding input pin 306. The operations of the test apparatus 100 and the device for calibration 300 when measuring the skews between the drivers 36 may be equal to an example described with reference to FIG. 2. As described above, even when using the device for calibration 300 of the present example, it is possible to measure each skew with high precision.

Figure 18:
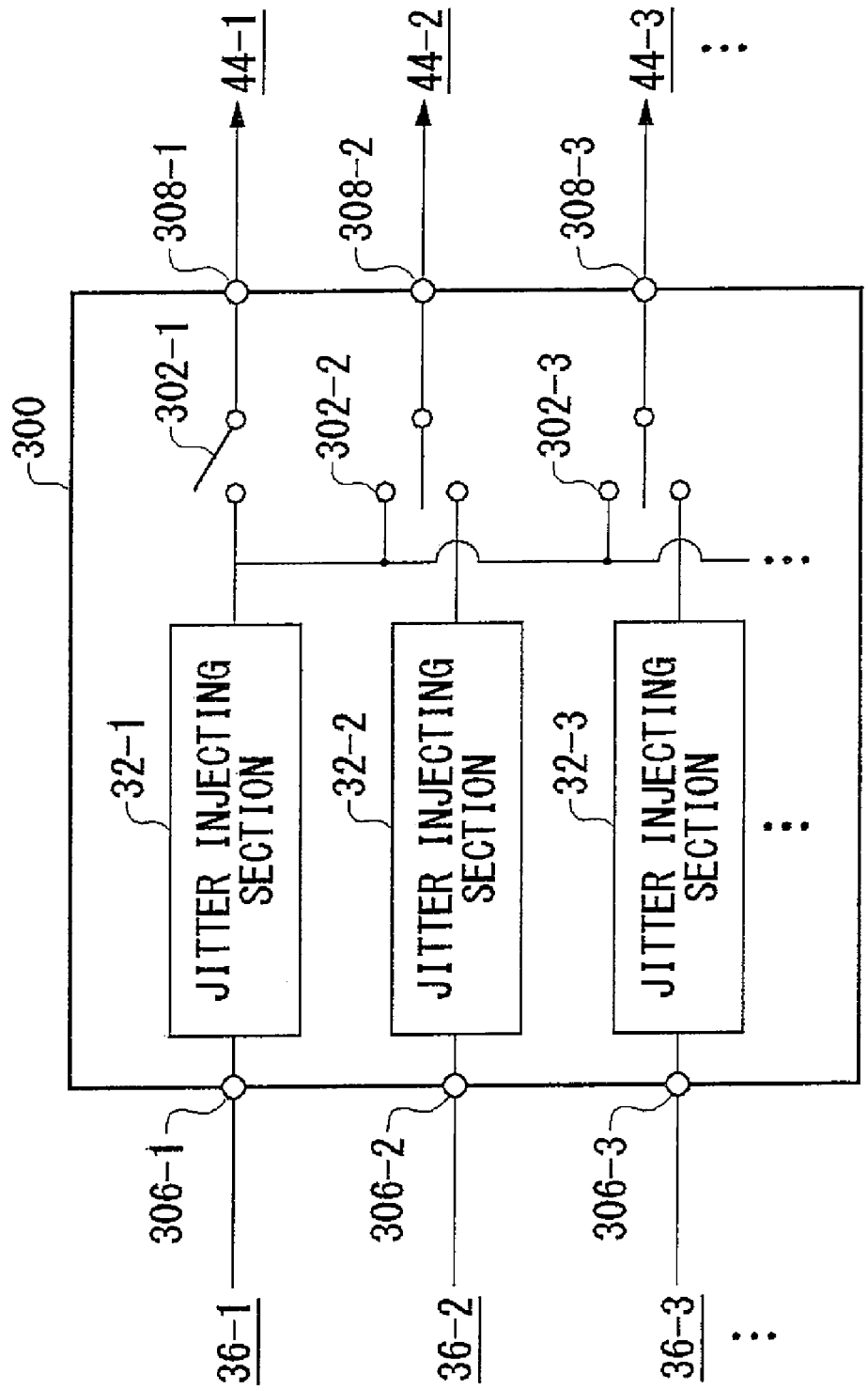
FIG. 18 is a view showing another configuration example of a device for calibration 300.

FIG. 18 is a view showing another configuration example of the device for calibration 300. The device for calibration 300 of the present example further includes a plurality of jitter injecting sections 32 in addition to the configuration of the device for calibration 300 described with reference to FIG. 2. In addition, when using the device for calibration 300 of the present example, the test apparatus 100 may not include the jitter injecting section 32 between the pattern generating section 10 and the driver 36.

Each of the jitter injecting sections 32 injects a jitter into a signal received by the corresponding input pin 306. When measuring the skews between the comparators 44, each of the connection switching sections 302 connects each of the output pins 308 into the common jitter injecting section 32. According to this, a common adjustment signal is split and input into the plurality of output pins 308, and is input into the corresponding comparator 44.

Moreover, when measuring the skews between the drivers 36, each of the connection switching sections 302 connects the corresponding output pin 308 to the corresponding input pin 306. According to this, a jitter can be injected into an adjustment signal from each the driver 36 to be measured in each comparator 44. As described above, when using the device for calibration 300 of the present example, it is possible to measure each skew with high precision even in the test apparatus 100 that does not have the jitter injecting section 32.

As apparent from the above descriptions, according to the test apparatus 100 of an embodiment of the present invention, it is possible to measure and adjust skews between the plurality of drivers 36 and skews between the plurality of comparators with high precision. For this reason, it is possible to test the device under test 200 with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus constructed and arranged to test a device under test comprising:

first and second comparators configured and arranged to measure, at a sampling rate determined by a sampling clock, a measured signal that is output from the device under test;

a deciding section that decides a quality of the device under test on the basis of a measurement result provided by the first and second comparators;

a jitter injecting section configured to inject jitter into a test signal to be provided to the device under test and to provide to the first and second comparators an adjustment signal having the same jitter injected into the test signal;

a skew computing section configured to compute a skew between the first comparator and the second comparator on the basis of a sampling result in the first comparator and a sampling result in the second comparator; and a phase adjusting section constructed and arranged to adjust a phase of at least one of the measured signal and the sampling clock on the basis of an amount of skew computed by the skew computing section, wherein the skew computing section includes:

a first phase computing section configured to compute, from a sampling result of the first comparator, a phase of the adjustment signal to be provided to the first comparator; and a second phase computing section configured to compute, from a sampling result of the second comparator, a phase of the adjustment signal to be provided to the second comparator, and wherein the skew computing section is configured to compute the skew on the basis of a difference between phases computed by the first phase computing section and the second phase computing section, respectively.

2. A test apparatus as claimed in claim 1, further comprising:

a first driver and a second driver configured and arranged to provide the test signal at a given output timing, and wherein the jitter injecting section is configured to inject jitter into the test signal from the first driver and the second driver, and the first comparator and the second comparator are configured and arranged to sample the adjustment signal.

3. The test apparatus as claimed in claim 2, wherein the first comparator and the second comparator are configured to respectively sample the adjustment signal when adjusting the skew of the first comparator and the second comparator.

4. The test apparatus as claimed in claim 1, wherein the first comparator and the second comparator are configured to substantially simultaneously measure split and adjustment signals.

5. The test apparatus as claimed in claim 1, wherein the skew computing section further includes:

a timing jitter computing section configured to compute a first timing jitter sequence of the adjustment signal to be input to the first comparator on the basis of the first sampling result in the first comparator and configured to compute a second timing jitter sequence of the adjustment signal to be input into the second comparator on the basis of the second sampling result in the second comparator;

a shift section configured to sequentially shift at least one timing of the first timing jitter sequence and the second timing jitter sequence by a shift amount that is an integer multiple of a period of the adjustment signal;

a correlation computing section configured to compute correlation values of the first timing jitter sequence and the second timing jitter sequence for each shift amount in the shift section;

a coarse skew computing section configured to detect a shift amount in which a correlation value computed by the correlation computing section becomes maximum and compute a component of an integer multiple of the period of the adjustment signal in the skew between the first comparator and the second comparator on the basis of the detected shift amount; and a fine skew computing section configured to compute a component smaller than the period of the adjustment signal in the skew between the first comparator and the second comparator.

6. The test apparatus as claimed in claim 1, wherein jitter in the adjustment signals has a distribution of jitter components delaying a phase of an edge of the adjustment signal and a distribution of jitter components advancing the phase of the edge that are substantially symmetric.

7. The test apparatus as claimed in claim 6, wherein for jitter injected into the adjustment signal, an amplitude modulating an edge of the measured signal in a time direction is larger than a period of the sampling clock.

8. The test apparatus as claimed in claim 1, wherein a jitter waveform of a component delaying a phase of an edge of the adjustment signal and a jitter waveform of a component advancing the phase of the edge of the adjustment signal are substantially symmetric.

9. The test apparatus as claimed in claim 8, wherein the jitter waveform of the delaying component of the adjustment signal and the jitter waveform of the advancing component of the adjustment signal alternate.

10. The test apparatus as claimed in claim 1, wherein the phase computing section is configured to compute a mean value of edge positions in each cycle of the adjustment signal as a phase of the adjustment signal.

11. The test apparatus as claimed in claim 1, wherein the phase computing section includes:

an analytic signal computing section configured to compute an analytic signal of the adjustment signal on the basis of the sampling result in the comparator;

an instantaneous phase computing section configured to compute an instantaneous phase of the adjustment signal on the basis of the analytic signal; and an initial phase computing section configured to compute an initial phase angle of the adjustment signal on the basis of the instantaneous phase of the adjustment signal.

12. The test apparatus as claimed in claim 1, wherein the phase computing section includes:

a spectrum computing section configured to compute a complex spectroscopic signal obtained by performing discrete Fourier transform on the sampling result in the comparator;

a carrier extracting section configured to extract a carrier frequency component of the adjustment signal in the complex spectroscopic signal; and a phase angle computing section configured to compute a phase angle of the carrier frequency component of the adjustment signal.

13. A test apparatus that tests a device under test, comprising:

a first driver and a second driver configured to measure a test signal to be input into the device under test at a given timing;

a deciding section configured to determine a quality of the device under test on the basis of a measured signal output from the device under test responsive to the test signal;

a jitter injecting section configured to inject jitter into the test signal output from the first driver and the second driver and provide a first adjustment signal and a second adjustment signal having the same jitter injected into the test signal;

a first sampling section and a second sampling section configured to sample the first adjustment signal and the second adjustment signal at a given sampling clock timing;

a skew computing section configured to compute a skew between the first driver and the second driver on the basis of sampling results of the first sampling section and the second sampling section; and a phase adjusting section configured to adjust the output timing of at least one of the first driver and the second driver on the basis of a skew computed from the skew computing section, wherein the skew computing section includes:

a first phase computing section configured to compute, from a sampling result of the first sampling section, a phase of the adjustment signal to be provided to the first sampling section; and a second phase computing section configured to compute, from a sampling result of the second sampling section, a phase of the adjustment signal to be provided to the second sampling section, and wherein the skew computing section is configured to compute the skew on the basis of a difference between phases computed by the first phase computing section and the second phase computing section respectively.

14. A device for calibration useful for measuring a skew between drivers in a test apparatus having a plurality of drivers for outputting test signals to a device under test and a plurality of comparators for measuring measured signals from the device under test, the device for calibration comprising:

a plurality of inputs corresponding respectively to the plurality of drivers and configured to receive the test signal from the corresponding driver;

a jitter injecting section configured to inject jitter into the respective test signals received by the inputs;

a plurality of outputs corresponding respectively to the plurality of comparators and configured to output each of the test signals having the jitter injected by the jitter injecting section into the corresponding comparators; and a connection switching section configured to connect the test signal from the corresponding input into each output via the jitter injecting section when measuring a skew between the plurality of drivers and mutually connect the test signal from any one of the inputs into the plurality of outputs via the jitter injecting section when measuring a skew by the plurality of comparators, wherein the device for calibration is mounted on the test apparatus in place of the device under test when a calibration is performed.

15. A device for calibration that is useful for measuring a skew between comparators in a test apparatus having a driver for supplying a signal and a plurality of comparators for measuring measured signals from a device under test, the device for calibration comprising:

an input configured to receive the signal from the driver;

a jitter injecting section configured to inject a jitter into the signal received by the input; and a plurality of outputs respectively corresponding to the plurality of comparators, split and configured to output the signal having the jitter injected by the jitter injecting section into the corresponding comparator, wherein the device for calibration is mounted on the test apparatus in place of the device under test when a calibration is performed.

16. A device for calibration that is useful for measuring a skew between drivers and a skew between comparators in a test apparatus having a plurality of drivers for outputting test signals to a device under test and a plurality of comparators for measuring measured signals from the device under test, the device for calibration comprising:

a plurality of inputs respectively corresponding to the plurality of drivers, each receiving its signal from the corresponding driver, the signal having been injected with jitter by a jitter injecting section located in the device for calibration or in the test apparatus;

a plurality of outputs respectively corresponding to the plurality of comparators, each outputting its respective jitter injected signal into the corresponding comparator; and a connection switching section that connects the signal received by the corresponding input into each output when measuring the skew by the plurality of drivers and mutually connects the signal received by any one of the inputs into the plurality of outputs when measuring the skew by the plurality of comparators, wherein the device for calibration is mounted on the test apparatus in place of the device under test when a calibration is performed.

17. A device for calibration that is useful for measuring a skew between comparators in a test apparatus having a plurality of comparators for measuring measured signals from a device under test, the device for calibration comprising:

a signal generating section that generates a signal having been injected with jitter by a jitter injecting section located in the device for calibration or in the test apparatus; and a plurality of outputs respectively corresponding to the plurality of comparators, respectively split and configured to output the jitter injected signal from the signal generating section into the corresponding comparator, wherein the device for calibration is mounted on the test apparatus in place of the device under test when a calibration is performed, wherein the test apparatus includes a plurality of drivers for inputting test signals into the device under test, and wherein the device for calibration further comprises:

a plurality of inputs respectively corresponding to the plurality of drivers and receiving the test signals from the corresponding drivers, the test signals having a jitter previously injected by the jitter injecting section in the test apparatus; and a connection switching section that connects the test signal received by the corresponding inputs into each output when measuring a skew by the plurality of drivers and mutually connects the signal generated from the signal generating section into the plurality of outputs when measuring the skew by the plurality of comparators.

* * * * *